United States Patent [19]
Kusunoki et al.

[11] Patent Number: 5,196,908
[45] Date of Patent: Mar. 23, 1993

[54] MICRO MIS TYPE FET AND MANUFACTURING PROCESS THEREFOR

[75] Inventors: Shigeru Kusunoki; Shigeki Komori; Katsuhiro Tsukamoto, all of Hyogo, Japan

[73] Assignee: Mitsubishi Denki Kabushiki Kaisha, Tokyo, Japan

[21] Appl. No.: 637,871

[22] Filed: Jan. 8, 1991

[30] Foreign Application Priority Data

Jan. 12, 1990 [JP] Japan .................................. 2-5161

[51] Int. Cl.$^5$ ..................... H01L 29/10; H01L 29/78
[52] U.S. Cl. ............................... 357/23.3; 357/23.12
[58] Field of Search ............... 357/23.3, 23.12, 23.7, 357/23.11, 90

[56] References Cited
U.S. PATENT DOCUMENTS
4,242,691 12/1980 Kotani et al. ........................ 357/23.3

OTHER PUBLICATIONS
"Advanced MOS Device Physics", VLSI Electronics Microstructure Science, by Ping K. Ko, vol. 18, pp. 1-9, 1989.
"Three-Dimensional Analysis of Subthreshold Swing and Transconductance for Fully Recessed Oxide (Trench) Isolated ¼-m-Width MOSFET's", IEEE Transactions on Electron Devices, vol. 35, No. 7, by Naoyuki Shigyo et al., Jul. 1988, pp. 945-951.
"Current Trends in MOS Process Integration", VLSI Electronics Microstructure Science, by Alan G. Lewis and John Y. Chen, vol. 18, pp. 85-89, 1989.
"MOSFET Modeling for Circuit Simulation", VLSI Electronics Microstructure Science, vol. 18, by Narain D. Arora and Llanda M. Richardson, pp. 237-245, 1989.
"Theory of Semiconductor Surfaces" and Characteristics of Surface Space-Charge Regions, Physics and Technology of Semiconductor Devices, by A. S. Grove, pp. 264-271, 1967.
"Surface Field-Effect Transistors" and Characteristics of Surface Field-Effect Transistors, Physics and Technology of Semiconductor Deivces, by A. S. Grove, pp. 321-327, 1967.

*Primary Examiner*—Mark V. Prenty
*Attorney, Agent, or Firm*—Lowe, Price, LeBlanc & Becker

[57] ABSTRACT

A micro MIS type FET comprises first conductivity type source/drain regions formed in a surface of a semiconductor layer mutually spaced apart by a distance of less than 2 μm, a second conductivity type channel layer having an impurity concentration of less than $1 \times 10^{16}/cm^3$ formed between the source/drain regions to have a depth less than depths of the source/drain regions, and a second conductivity type threshold voltage control region having an impurity concentration of more than $1 \times 10^{17}/cm^3$ beneath the channel layer.

4 Claims, 24 Drawing Sheets

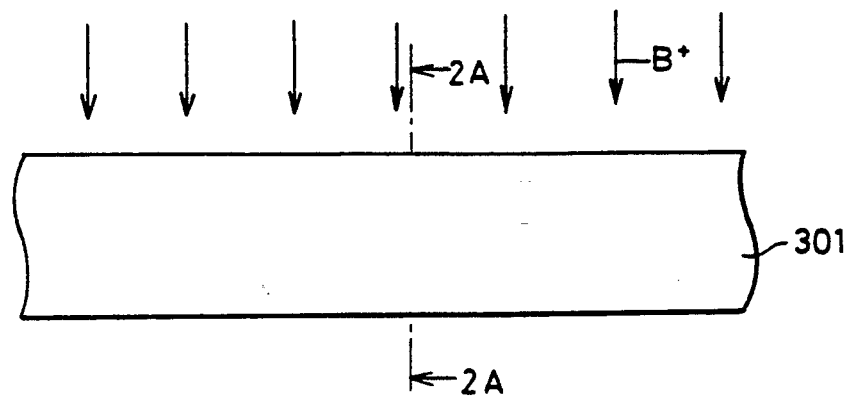
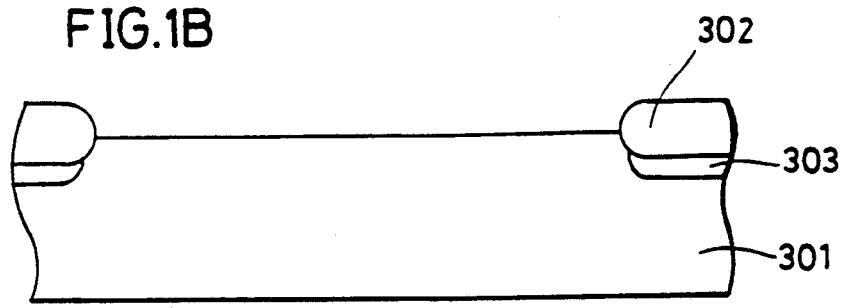
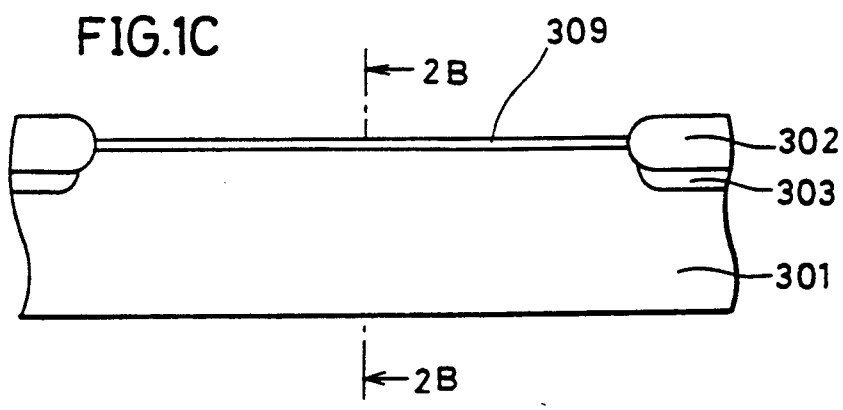

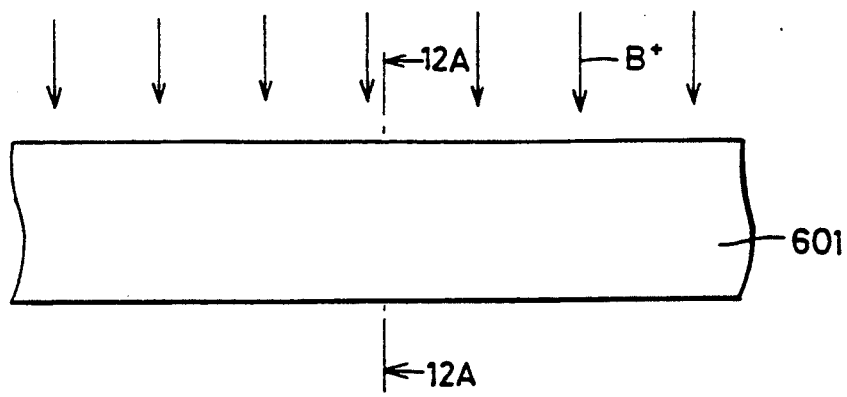
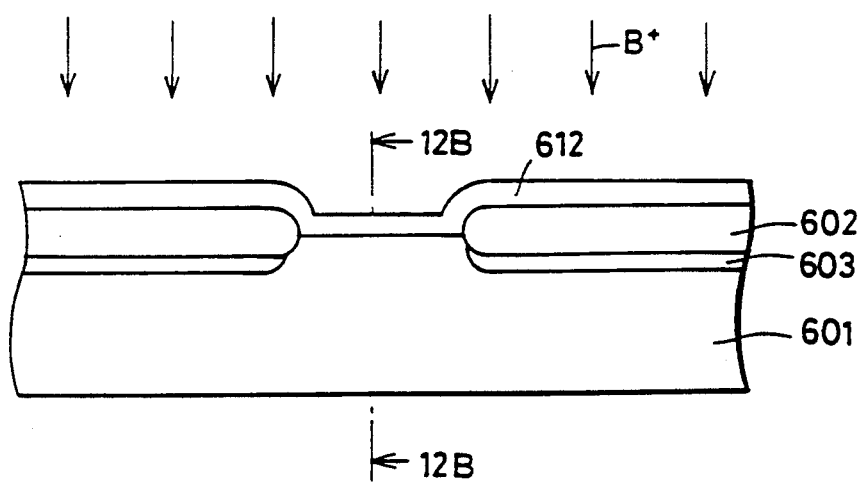
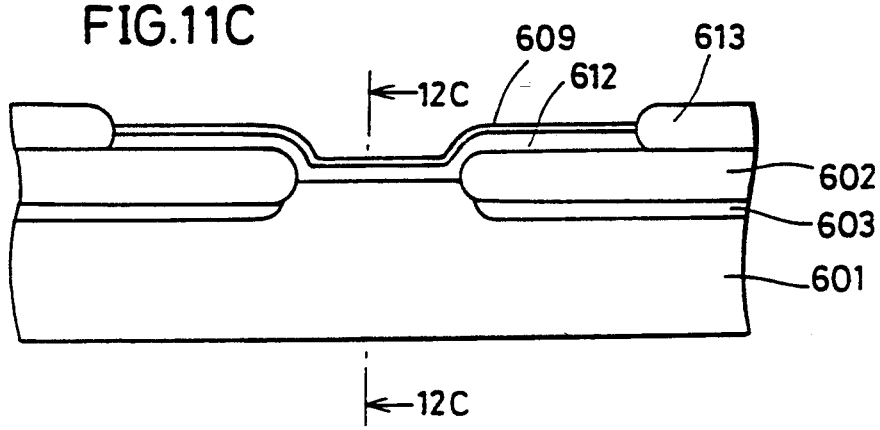

IMPURITY CONCENTRATION (cm$^{-3}$)

DEPTH (nm)

IMPURITY CONCENTRATION (cm$^{-3}$)

DEPTH (nm)

IMPURITY CONCENTRATION (cm$^{-3}$)

DEPTH (nm)

MICRO MIS TYPE FET AND MANUFACTURING PROCESS THEREFOR

BACKGROUND OF THE INVENTION

1. Field of the Invention

The present invention relates to a process of manufacturing MIS (Metal . Insulator . Semiconductor) type FETs (Field Effect Transistor), and more particularly, to a process of manufacturing micro MIS type FETs having a short channel layer between the source/drain regions.

2. Description of the Related Art

In accordance with the miniaturization of semiconductor devices, the impurity concentration of the semiconductor substrate is liable to be increased by the scale down law. Semiconductor devices operated at low temperatures are being investigated in order to lower the supply voltage or the threshold voltage in micro semiconductor devices. The scale down law is described in details in VLSI Electronics: Microstructure Science, Vol. 18, pp. 1-9, edited by N. G. Einspruch and G. S. Gildenblat and published by Academic Press, Inc.

FIGS. 15A-15F are sectional views showing the structure of and the process for manufacturing a conventional micro n-channel MISFET with a channel of approximately 0.3 μm in length and approximately 10 μm in width.

Referring to FIG. 15A, boron ions B+ are implanted into a p-type silicon substrate 101 (normally having an impurity concentration of $10^{15}/cm^3$) as indicated by the arrows at the acceleration voltage of approximately 100 KeV and with the dose rate of approximately $5 \times 10^{13}/cm^2$. Then, the implanted impurities are diffused into the substrate at a temperature higher than 1000° C. for several hours, resulting in the impurity concentration distribution shown in FIG. 16A. FIG. 16A indicates the impurity concentration distribution in substrate 101 at a section taken along line 16A—16A of FIG. 15A. The abscissa axis represents the depth (nm) from the surface of silicon substrate 101, while the ordinate axis represents the impurity concentration ($cm^{-3}$). It can be seen that the impurity concentration in the vicinity of the surface of silicon substrate 101 is increased to approximately $1 \times 10^{17}/cm^3$.

Referring to FIG. 15B, an isolation oxide film 102 with a thickness of more than 400 nm is formed by thermal oxidation. Beneath the isolation oxide film 102, boron ions have been previously selectively implanted to form a channel cut region 103 having an impurity concentration of approximately $1 \times 10^{18}/cm^3$.

Referring to FIG. 15C, boron ions B+ are implanted into the shallow region of substrate 101 as indicated by the arrows at an acceleration voltage of 30–40 KeV and with the dose rate of approximately $2 \times 10^{13}/cm^2$ for the purpose of controlling threshold voltages. This results in the impurity concentration distribution as illustrated in FIG. 16B. FIG. 16B indicates an impurity concentration distribution in substrate 101 at a section taking along line 16B—16B of FIG. 15C. It is noted that a buried peak of the impurity concentration exceeding $1 \times 10^{18}/cm^3$ is formed in the vicinity of the surface of substrate 101.

Referring to FIG. 15D, a gate insulating oxide film 104 with the thickness of approximately 7 nm is formed. On the gate insulating film 104, an n-type polycrystalline silicon gate electrode 105 with the thickness of approximately 300 nm is formed.

Referring to FIG. 15E, arsenic ions are implanted into substrate 101 at the acceleration voltage of 50 KeV and with the dose rate of $1 \times 10^{15} - 5 \times 10^{15}/cm^2$ using gate electrode 105 and isolation oxide film 102 as masks. The implanted arsenic ions are annealed for about 30 minutes at the temperature of 800° C.-900° C. so that a source/drain region 106 is formed. The boron concentration within substrate 101 at a section taken along line 16C—16C of FIG. 15E is as shown in FIG. 16C. It is seen that the buried peak of the boron concentration in the vicinity of the surface of substrate 101 is slightly lower than $1 \times 10^{18}/cm^3$.

Referring to FIG. 15F, an interlayer insulating film 107 is deposited to the thickness of approximately 600 nm, and a contact hole 107a is formed by etching. Thereafter, a layer of metal such as aluminum is deposited, by which a source/drain electrode 108 is formed by means of patterning. This completes the formation of a micro n-channel MISFET by prior art.

FIG. 17A shows the relationship between gate voltage $V_G$ and drain current $I_D$ of the N channel MISFET of FIG. 15F. The abscissa represents gate voltage $V_G$ (V), while the ordinate represents drain current $I_D$ (Ma). In FIG. 17A, it is assumed that the substrate voltage and the source voltage are 0 V, while the drain potential $V_D$ is 0.1 V. When drain voltage $V_D = 0.1$ V, the transconductance $g_m$ of the MISFET is represented as:

$$g_m = \frac{\partial I_D}{\partial V_G} \bigg| V_D = 0.1V$$

which indicates that the conventional micro n-channel MISFET with a channel of approximately 0.3 μm in length and approximately 10 μm in width has a conductance $g_m$ of approximately 0.480 Ms (S=1/Ω).

Referring to FIG. 17B, the relationship between drain voltage $V_D$ and drain current $I_D$ in the MISFET of FIG. 15F is depicted. The abscissa represents drain voltage $V_D$ (V), while the ordinate represents drain current $I_D$ (Ma). In FIG. 17B, the substrate potential and the source potential are 0 V, while gate voltage $V_G$ is 5 V.

Referring to FIG. 18A, an inverter circuit comprising a conventional n-channel MISFET as a driver is shown. The inverter circuit comprises an input terminal 1, a power supply terminal 2, a load resistor 3, a driver MISFET 4, and an output terminal 5.

FIG. 18B shows the operating characteristics of the n-channel MISFET 4 in the inverter of FIG. 18A in conjunction with its relation to the operating characteristics of various load resistors 3. The abscissa represents drain voltage $V_D$ (V), while the ordinate represents drain current $I_D$ (Ma). In FIG. 18B, source voltage $V_{DD}$ has been selected to be 3 V, with lines 3a and 3c representing the instances of a low resistance of 670Ω and a high resistance of 3000Ω of load 3, respectively. Line 3c denotes the case where the resistance of load 3 is slightly lower than the ON resistance of driver FET 4. According to Kirchhoff's law, current $I_D$ which flows through the drain of driver FET 4 is equal to the current which flows through load resistor 3, and the sum of the voltage of drain voltage $V_D$ in driver FET 4 and the voltage across load resistor 3 is equal to source voltage $V_{DD}$, in a steady state. Therefore, the operating point of the inverter of FIG. 18A is at the crossing point of the curve and the linear line of FIG. 18B.

FIG. 18C shows the static characteristics of output voltage Vout (V) at output terminal 5 when input voltage Vin (V) is supplied to the input terminal of the driver in FIG. 18A, while FIG. 18D shows the static characteristics of the consumption current $I_D$ (mA) which flows through the drain of driver FET 4 at that time. In these graphs, curves 3a, 3b, and 3c represent the instances where load 3 has a low resistance, a medium level resistance, and a high resistance, respectively. If $C_0$ is the capacity of the fan out of the inverter, charge Q accumulated for time t (sec) is given by the following equation (1):

$$Q = \int_0^{V(t)} C_0 (Vout)dVout = \int_0^t Iout(t)dt \quad (1)$$

When the output capacitance $C_0$ is constant, this equation indicates that the greater consumption current $I_D$ (t) is, the faster the output potential of the inverter will rise, resulting in a faster operating rate of the inverter. Here, Iout(t) represents the current passing through the output terminal and then Iout(t) becomes large when $I_D$(t) is large. Therefore, from the standpoint of the operating rate of the inverter, it is preferable to have the resistance of load 3 as low as possible, as can be appreciated from FIG. 18D. However, the output voltage Vout of the inverter should have a great difference between the ON voltage and the OFF voltage in order to prevent the malfunction of the digital circuit comprising the inverter (in practice, curve 3b in FIG. 18C is preferred). In the case that the load resistance is small, $I_D$(t) does not increase so much, because it is limited in the saturation current ($I_D$.sat). At this time, on the other hand, the difference between the ON voltage and OFF voltage becomes small, as seen in FIG. 18C. In other words, when the load resistance is small, operational speed of the inverter is hardly increased and the inverter is liable to be adversely affected by noises. Consequently, it would be most preferable for load 3 to have a resistance similar to ON resistance which is defined as $\{V_D - V_D\text{-sat}(V_G = V_D)\}/I_D$-sat where $V_D$-sat denotes saturation voltage of driver FET 4 to allow the high speed operation of the inverter as well as preventing the malfunction of the digital circuit. In this case, the value of Iout(t) can be similar to that in the case of the low load resistance and then the ON-OFF voltage ratio can be similar to that in the case of the high load resistance. In other word, an inverter can be obtained which has a high operational speed and does not cause malfunction. If the ON resistance of driver FET 4 is further lowered, the resistance of load 3 also can be lowered at the equal amount while preventing the malfunction of the digital circuit and increase further the operating speed of the inverter.

Referring to FIG. 19, the relation of the impurity concentration with the mobility of the carriers in the silicon at room temperature is shown. The abscissa gives the total impurity concentration ($cm^{-3}$), while the ordinate gives the mobility ($cm^{-2}$/V·sec). Curve A represents the mobility of the electrons and curve B represents the mobility of the holes. As mentioned before, the impurity concentration of the semiconductor substrate is liable to be increased by the scale down law in accordance with the miniaturization of semiconductor devices. However, as can be seen from FIG. 19, when the impurity concentration of the substrate exceeds approximately $10^{16}/cm^3$, the mobility of the carriers rapidly decrease due to the transverse electric field at room temperature and due to the scattering of the impurities at cryogenic temperature. Accordingly, the improvement in the operating rate by miniaturization of conventional MISFETs will be limited because of the drop in transconductance $g_m$.

In accordance with the scale down law, the supply voltage should also be lowered corresponding to the miniaturization of the semiconductor device. This is because it is necessary to restrict the heating value in the high density integrated circuits comprising a number of micro semiconductor devices, and because micro semiconductor devices are liable to have low breakdown voltages. In order to lower the supply voltage, the threshold voltage of the MISFET must also be lowered, leading to the necessity of suppressing the subthreshold swing to a small range. The subthreshold swing S is given as $S \equiv \partial V_G/\partial(\log I_D)$ and described in details by N. Shigyo et al. in IEEE Transactions on Electron Devices, Vol. 35, 1988, pp.945-951. However, at the room temperature of $T = 300°$ K., the subthreshold swing decreases to only $(Kt/q) \log_e 10 \approx 60$ mV/decade even at its most ideal state. Therefore, the minimum threshold voltage Vth allowed to suppress the current leakage of the MISFET is decreased to only the degree of 0.5 V–0.6 V at room temperature. Thus, the operation of semiconductor devices at low temperatures is considered. At a low temperature, the lattice vibration is suppressed, whereby the effect of lattice scattering with respect to the mobility of the electrons is reduced. Hence, the effect of the scattering of the impurities in relation to the mobility of the electrons will become a relatively critical problem.

In addition, the input/output characteristics, i.e. the transfer characteristics in FIG. 18C show that the slopes of the transient region from on-state to off-state are relatively gentle, which means that there is the problem of the inverter being susceptible to the effect of external noise. Furthermore, since the logical amplitude of the output voltage (voltage range corresponding to logic "0" or "1") in conventional inverters is relatively small, the noise margin is small, which means that it is susceptible to noise effects. It is needless to say that the problem of noise is critical as semiconductor devices becomes more miniaturized, and is aggravated by the reduction of the source voltage and threshold voltage.

SUMMARY OF THE INVENTION

Taking the above problems of the prior art into consideration, an object of the present invention is to provide a high speed operating micro MISFET having a high carrier mobility.

Another object of the present invention is to provide a micro MISFET that is less susceptible to noise effects.

A further object of the present invention is to provide a micro MISFET that is applicable to high speed operation at low temperatures.

In one aspect of the invention, a micro MISFET comprises a first conductivity type source/drain region formed on the surface of a semiconductor layer mutually spaced apart by a distance of less than 2 μm, a second conductivity type channel layer with an impurity concentration of less than $1 \times 10^{16}/cm^3$ formed between the source/drain regions to a depth smaller than the bottom of the source/drain region, and a second conductivity type threshold voltage control region with an impurity concentration of more than $1 \times 10^{17}/cm^3$ beneath the channel layer.

In another aspect of the present invention, the method of manufacturing a micro MISFET comprises the steps of preparing a semiconductor layer of a first conductivity type having an impurity concentration of more than $1 \times 10^{17}/cm^3$ at least from the surface to a predetermined depth, growing an epitaxial layer of a first conductivity type having an impurity concentration of less than $1 \times 10^{16}/cm^3$ on the surface of the semiconductor layer, and forming second conductivity type source/drain regions spaced apart from each other with a distance of below 2 μm and each having a thickness from the surface of the epitaxial layer exceeding the bottom of the epitaxial layer to form a channel layer between the source/drain regions having the length of less than 2 μm with the impurity concentration of below $1 \times 10^{16}/cm^3$.

The inventive micro MISFET can operate at a high rate due to the fact that the channel layer has an impurity concentration of less than $1 \times 10^{16}/cm^3$ thereby maintaining or obtaining a high carrier mobility.

In accordance with the manufacturing method of the inventive micro MISFET, an epitaxial layer having an impurity concentration of below $1 \times 10^{16}/cm^3$ is formed on the semiconductor substrate having an impurity concentration of above $1 \times 10^{17}/cm^3$ to provide a micro MISFET comprising a channel layer having an impurity concentration of below $1 \times 10^{16}/cm^3$.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1A-1F are sectional views showing the process of manufacturing a micro MISFET in accordance with one embodiment of the invention.

FIGS. 11A-11F are sectional views showing the process of manufacturing a MISFET according to another embodiment of the invention.

DESCRIPTION OF THE PREFERRED EMBODIMENTS

Figure 1D:
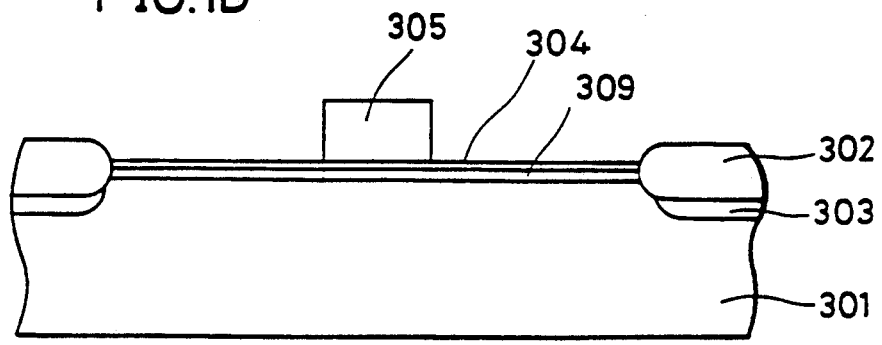

Referring to FIGS. 1A-1F, a description is given of the structure and the manufacturing process therefor of a micro n-channel MISFET having a channel length of approximately 0.3 μm from one to the other of two source/drain regions and a channel width of approximately 10 μm in accordance with an embodiment of the present invention.

Referring to FIG. 1A, boron ions B+ are implanted into a p-type silicon substrate 301 having the resistivity of 1-100Ω·cm, as indicated by the arrows at the acceleration voltage of approximately 100 KeV. The implanted ions are annealed at a temperature (usually 1100° C.) of more than 1000° C. for a sufficient period of time (usually 7 to 8 hours). The boron ions are implanted to the amount that the substrate will have after annealing an impurity concentration of approximately $5 \times 10^{17}/cm^3$ at least in the region from the surface to a predetermined depth (usually about 1000 nm). FIG. 2A illustrates the impurity concentration distribution in substrate 301 at a section taken along line 2A—2A of FIG. 1A. The abscissa indicates the depth (nm) from the surface of substrate 301, while the ordinate indicates the impurity concentration ($cm^{-3}$).

Referring to FIG. 1B, an isolation oxide film 302 is formed by thermal oxidation to the thickness of approximately 400 nm. Boron ions have been previously selectively implanted beneath the isolation oxide film 302, where a channel cut region 303 with the impurity concentration of approximately $1 \times 10^{18}/cm^3$ is formed.

The local oxidation process as mentioned above is well known and shown in more details on pages 85-89 in VLSI Electronics: Microstructure Science Vol. 18.

Referring to FIG. 1C, a p-type epitaxial layer 309 having the impurity concentration of less than approximately $1 \times 10^{15}/cm^3$ is grown at a relatively low temperature to the thickness of approximately 10-20 nm. The epitaxial layer 309 may also be formed by a solid phase growth of an amorphous silicon layer deposited on the silicon substrate 301 at a relatively low temperature. FIG. 2B shows an example of the impurity concentration distribution at a section taken along line 2B—2B of FIG. 1C. In the example of FIG. 2B, the epitaxial layer is formed to the thickness of 10 nm.

Figure 2A:
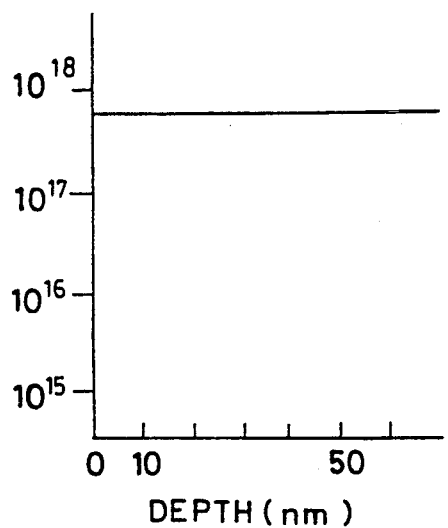
FIGS. 2A, 2B, and 2C are graphs showing the impurity concentration distributions at sections taken along line 2A—2A of FIG. 1A, line 2B—2B of FIG. 1C, and line 2C—2C of FIG. 1E, respectively.
Figure 2B:
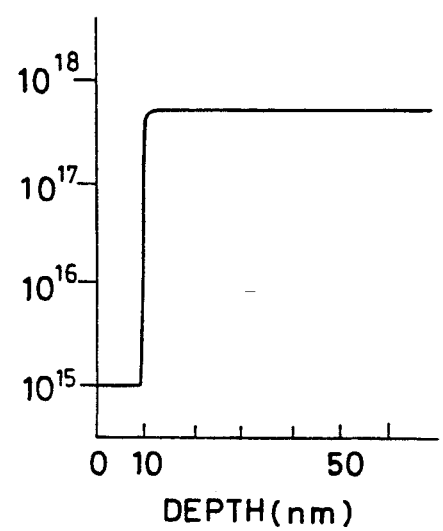

Referring to FIG. 1D, a gate insulating film 304 is deposited on epitaxial layer 309 to the thickness of approximately 7 nm at a relatively low temperature. Alternatively, the gate insulating film 304 may be formed by partially oxidizing epitaxial layer 309. However, in the case that gate insulating film 304 is formed by oxidation, epitaxial layer 309 must be previously made thick enough so as to take into account the thickness of the oxidized gate insulating film that will lessen the thickness of the epitaxial layer. Over gate insulating film 304, a gate electrode 305 of a n-type polycrystalline silicon having a high impurity concentration is formed to the thickness of approximately 300 nm.

Figure 1E:
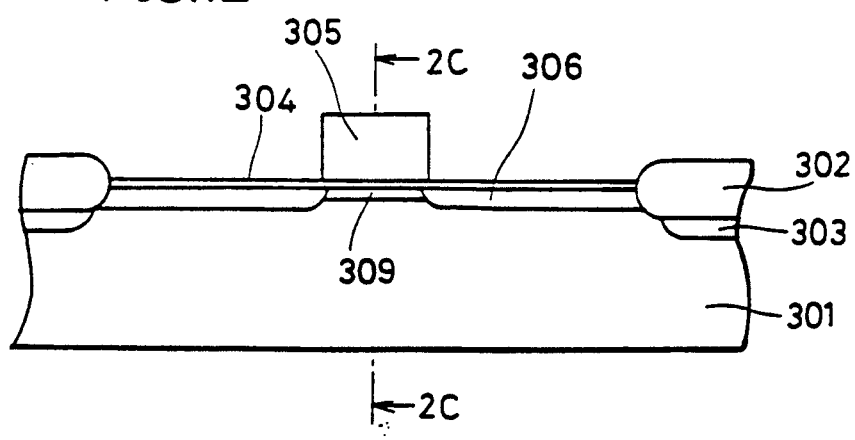
Figure 2C:
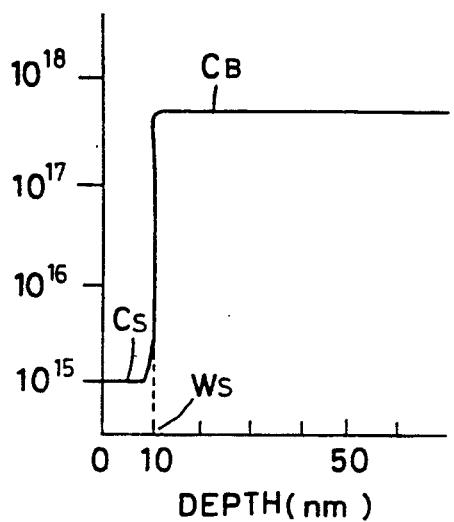

Referring to FIG. 1E, arsenic ions are implanted into substrate 301 at the acceleration voltage of 50 KeV and with the dose rate of $1 \times 10^{15} - 5 \times 10^{15}/cm^2$, using gate electrode 305 and isolation oxide film 302 as masks. The implanted arsenic ions are annealed for a short period of time at a relatively low temperature to form source/drain region 306 of about 100 nm thickness. FIG. 2C shows the impurity concentration distribution beneath the gate insulating film at the section taken along line 2C—2C of FIG. 1E. Since source/drain region 306 is annealed for a short period of time at a relatively low temperature, epitaxial layer 309 which is utilized as a channel layer has its impurity concentration slightly increased in the vicinity of the interface with substrate 301, as can be appreciated from FIG. 2C. However the low impurity concentration of below $1 \times 10^{15}/cm^3$ is maintained in the major part. In FIG. 2C, the reference numeral $C_S$ represents the impurity concentration of channel layer 309; $C_B$ represents the impurity concentration of substrate 301; and $W_S$ represents the thickness of channel layer 309.

Figure 1F:
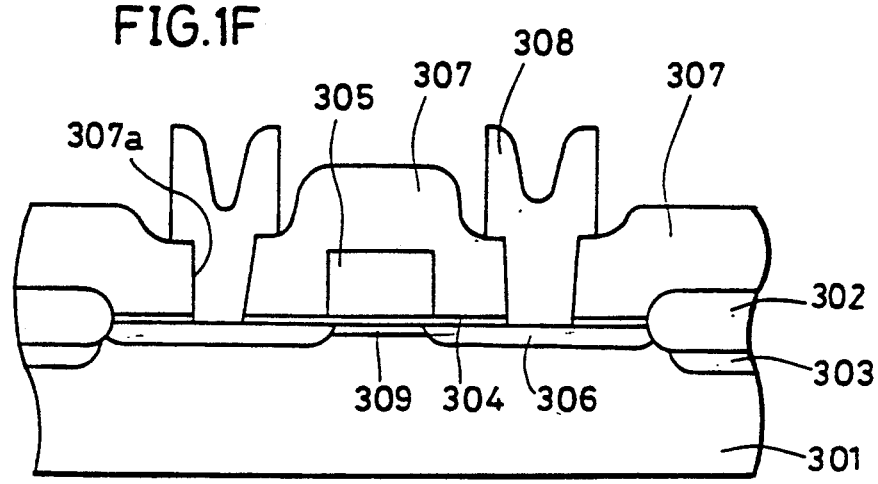

Referring to FIG. 1F, an interlayer insulating film 307 is deposited to a thickness of approximately 600 nm, and contact holes 307a are formed. Then a metal layer such as aluminum is deposited to form source/drain electrodes 308 by means of patterning. In this way, a micro n-channel MISFET is completed.

Figure 3:
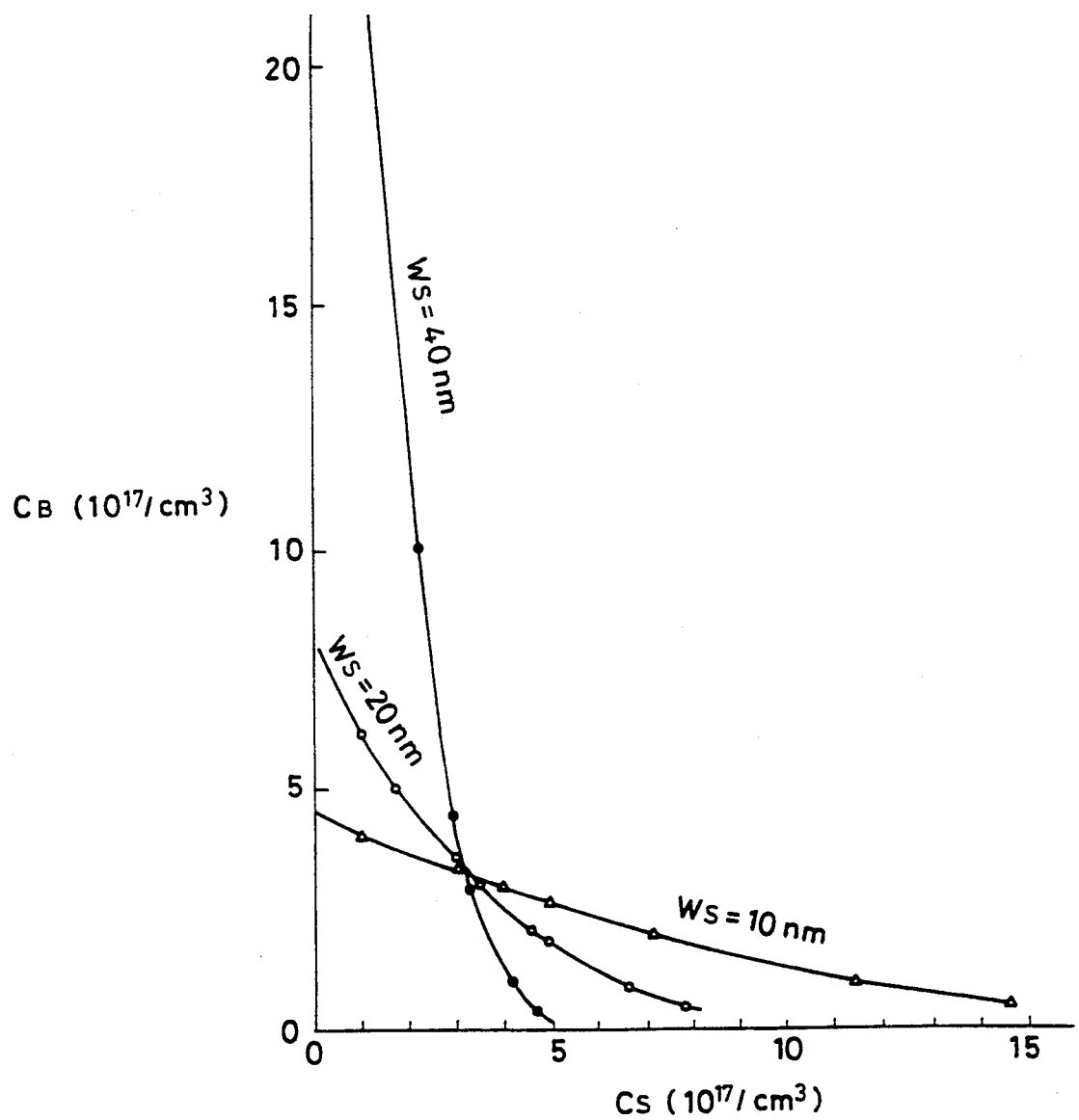
FIG. 3 is a graph showing the relationship between the impurity concentration $C_S$ of the channel layer and the impurity concentration $C_B$ of the substrate with respect to various thicknesses $W_S$ of the channel layer, required to set the threshold voltage to 0.6 V.

Referring to FIG. 3, the relationship required to set the threshold voltage Vth of the MISFET to 0.6 V is illustrated between the impurity concentration of the channel layer $C_S$ and the impurity concentration of the substrate $C_B$ for different channel layer thickness $D_S$. The abscissa represents the impurity concentration of the channel layer $C_S$ ($10^{17}/cm^3$), while the ordinate represents the impurity concentration of the substrate $C_B$ ($10^{17}/cm^3$). In this graph, it is assumed that the gate oxide film has a thickness of 7 nm, and the junction depths of the source/drain regions are approximately 100 nm. Even in the case that the impurity concentration $C_S$ in the channel layer is lowered to less than $1 \times 10^{16}/cm^3$, it can be seen from this graph that to maintain threshold voltage Vth=0.6 V, the thickness $D_S$ of the channel layer may be below approximately 20 nm when the impurity concentration $C_B$ of the substrate is approximately $8 \times 10^{17}/cm^3$, for example.

Figure 4B:
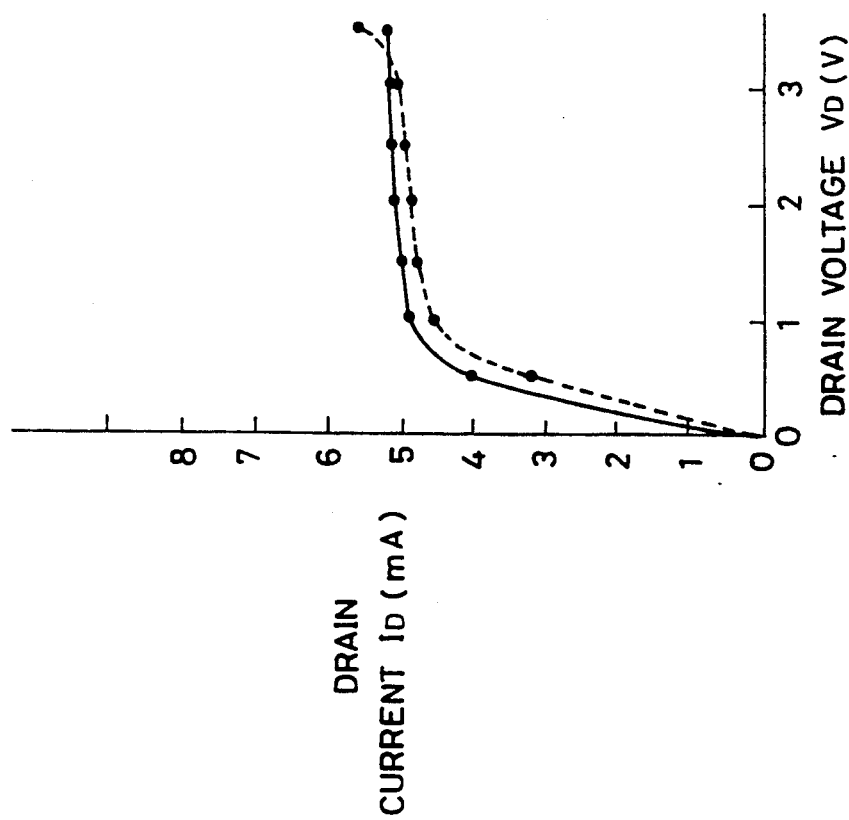
FIGS. 4A and 4B are graphs showing the characteristics of the MISFET in FIG. 1F.
Figure 4A:
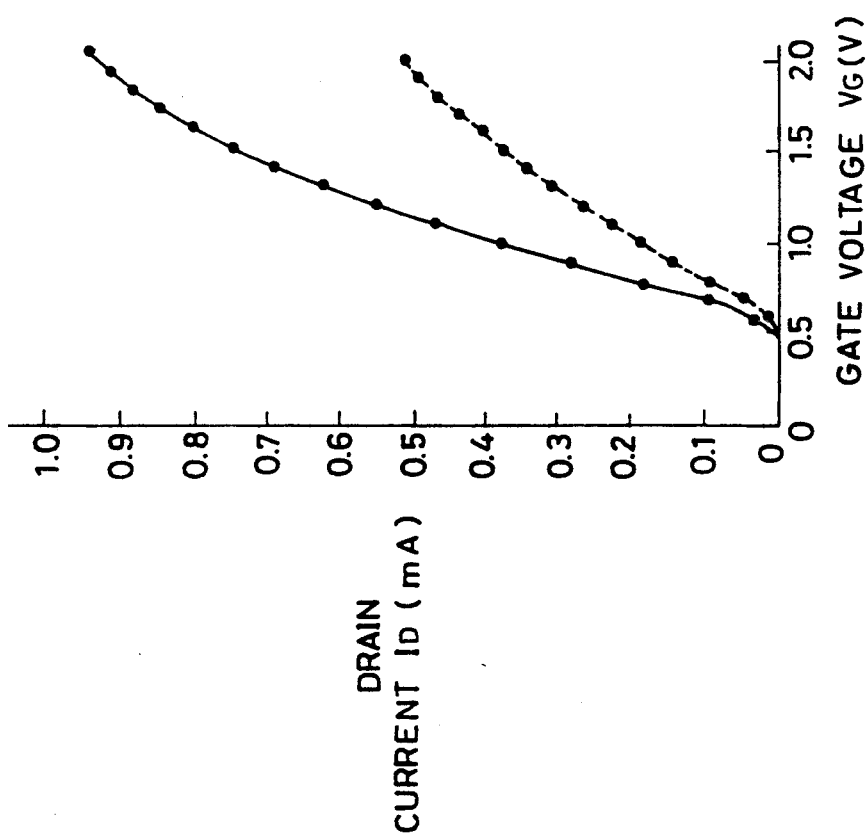
Figure 15A:
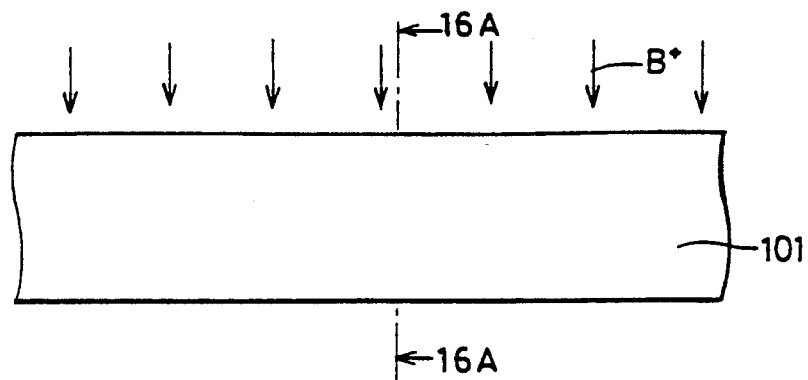
FIGS. 15A-15F are sectional views showing the process of manufacturing a MISFET according to the prior art.
Figure 15B:
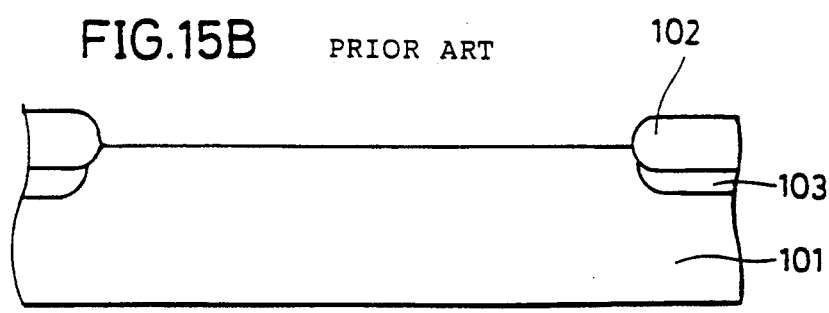
Figure 15C:
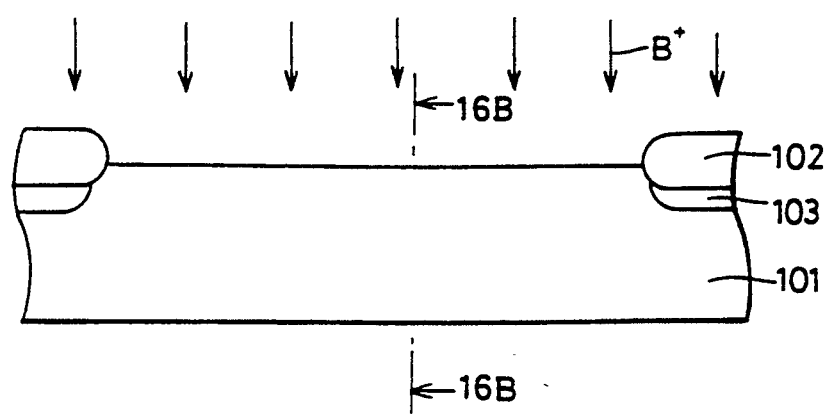
Figure 15D:
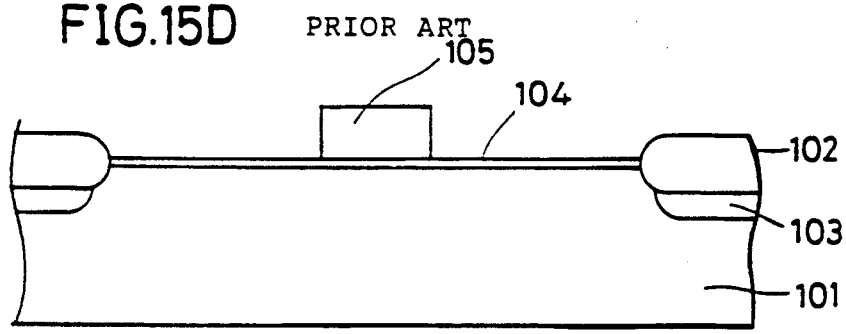
Figure 15E:
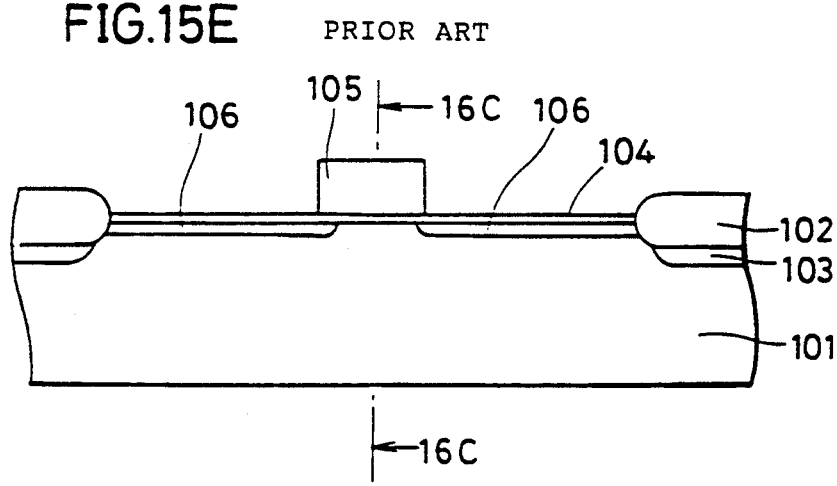
Figure 15F:
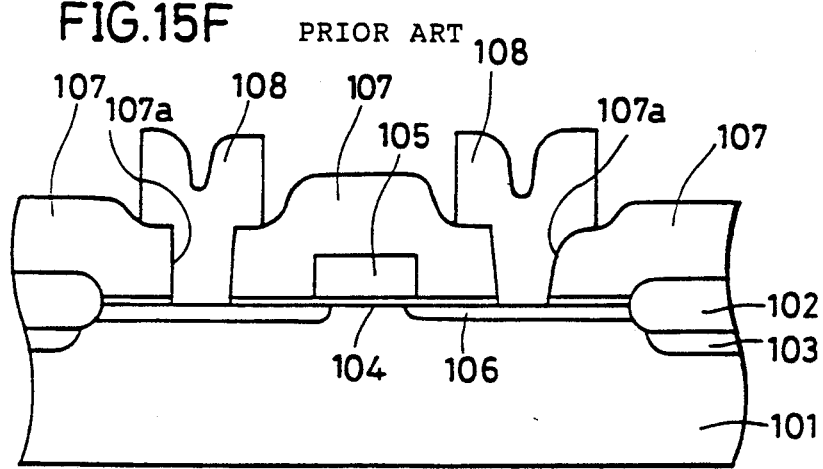
Figure 16A:
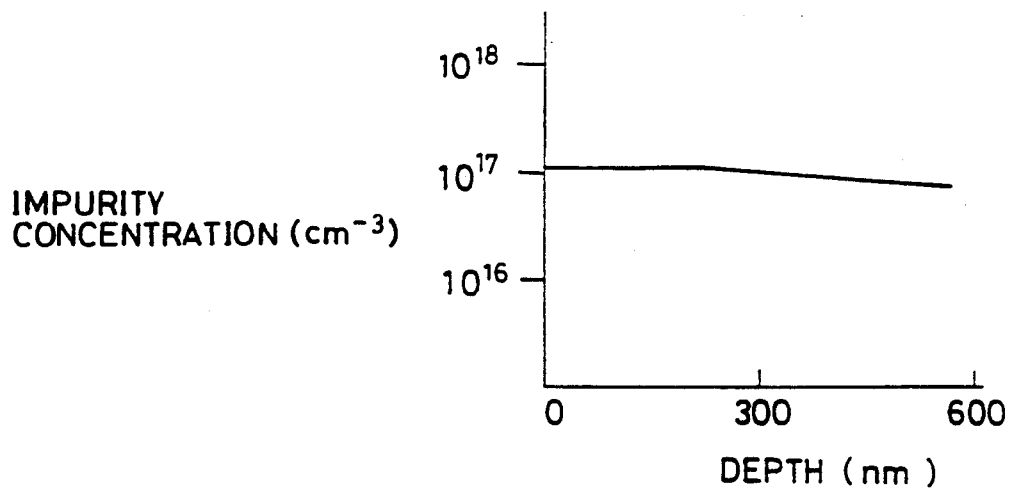
FIGS. 16A, 16B, and 16C are graphs showing the impurity concentration distributions at sections taken along 16A—16A in FIG. 15A, line 16B—16B in FIG. 15C, and line 16C—16C in FIG. 15E, respectively.
Figure 16B:
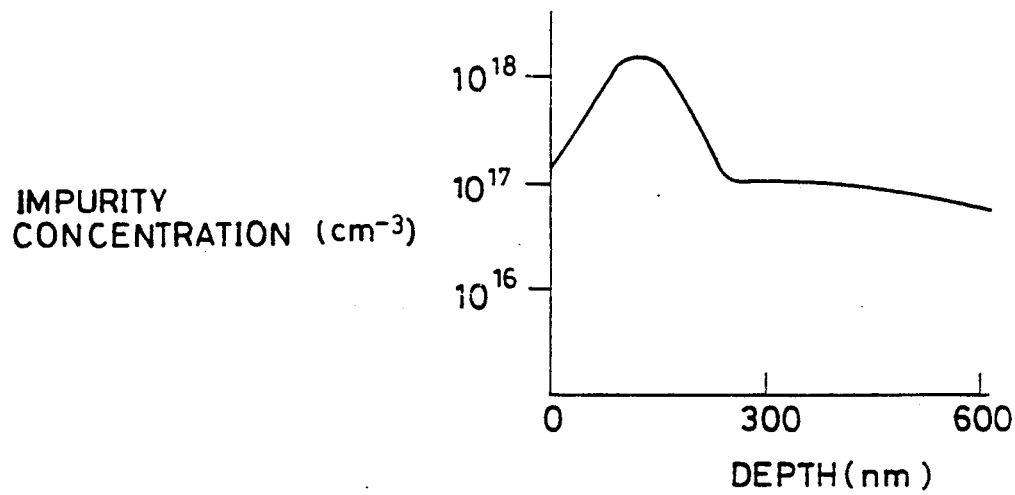
Figure 16C:
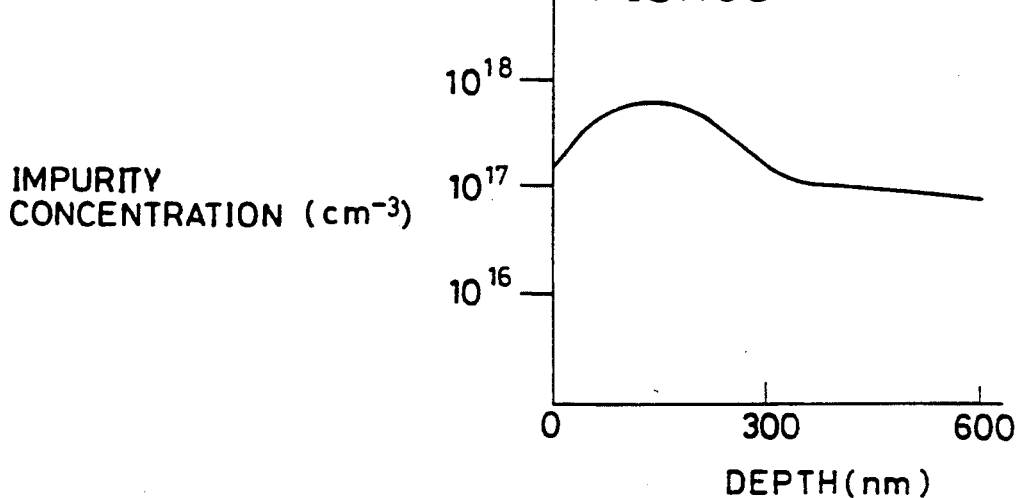
Figure 17B:
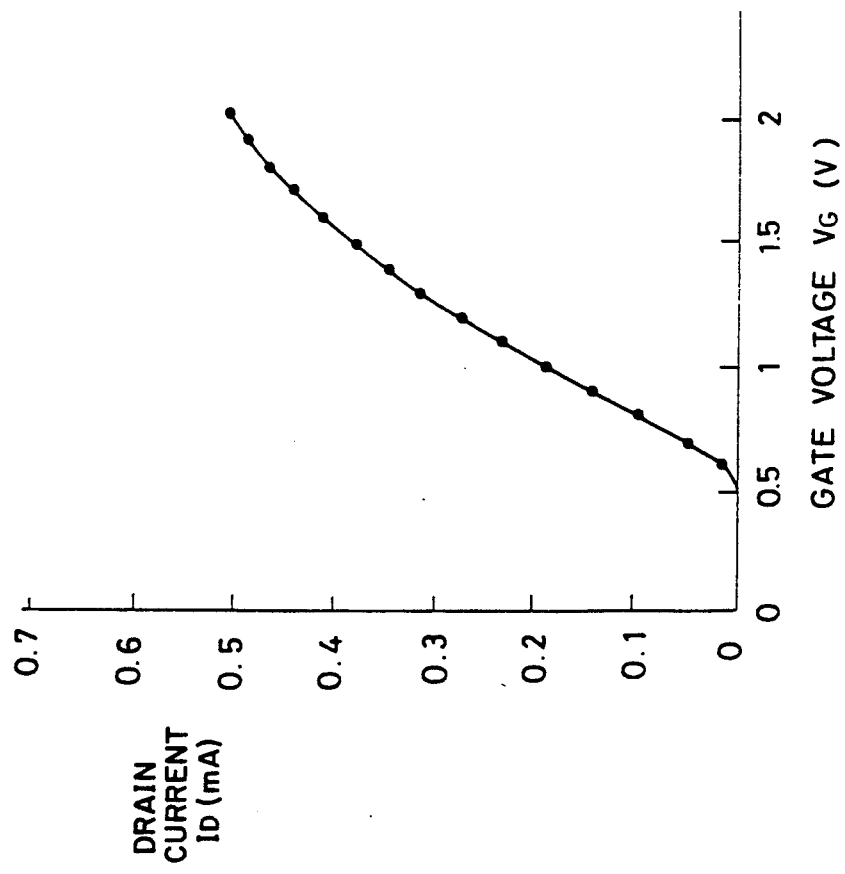
FIGS. 17A and 17B are graphs showing the characteristics of a conventional MISFET in FIG. 15F.
Figure 17A:
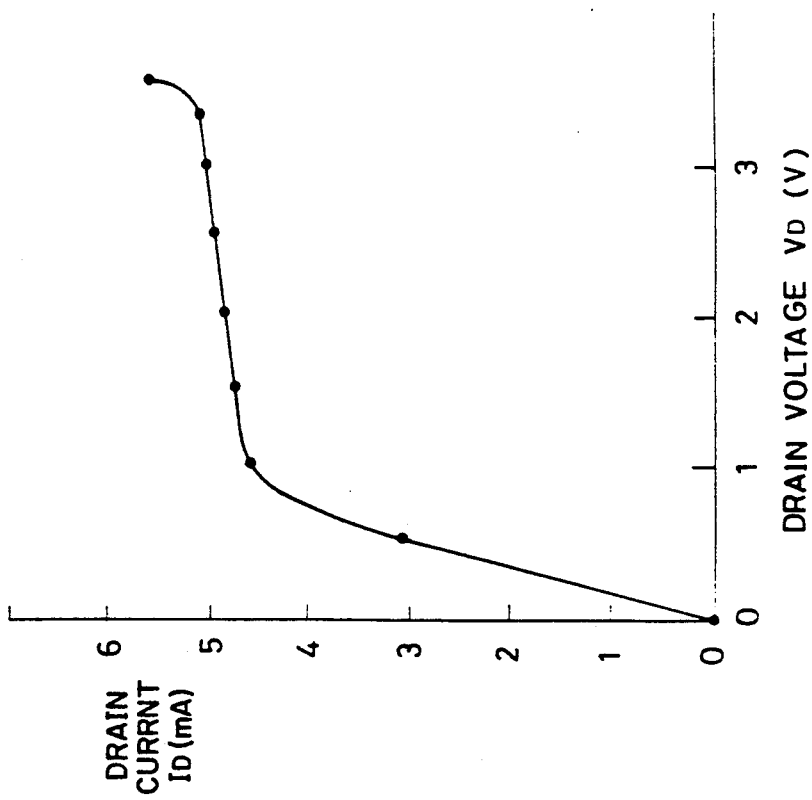

Referring to FIG. 4A, the relationship between gate voltage $V_G$ and drain current $I_D$ of the n-channel MISFET of FIG. 1F is shown in a solid line. In FIG. 4A, the substrate potential and the source potential are 0 V, and the drain potential is 0.1 V. The broken line curve shows the $V_G$-$I_D$ relationship of a conventional MISFET in FIG. 15F for comparison. From this graph, it is seen that the conductance $g_m = \partial I_D / \partial V_G$ of the MISFET of FIG. 1F is approximately 1000 μS, having a value larger than twice the value of the MISFET's conductance $g_m = 480$ μS in FIG. 17A.

Referring to FIG. 4B, the relationship between the drain voltage $V_D$ and the drain current $I_D$ of the MISFET in FIG. 1F is shown in a solid line. In this graph, the substrate potential and the source potential are 0 V, while the gate electrode is 5 V. The broken line curve shows the $V_D$-$I_D$ relationship of the conventional MISFET in FIG. 15F for comparison. Since the MISFET of FIG. 1F has a channel layer of low impurity concentration, it can be seen that the drain current increases at the triode region, and the conductance $g_m$ is high. The triode region represents the slope region (from 0 to about 4 mA of $I_D$ in FIG. 4B) of curve $V_D$-$I_D$. It can also be seen that the drain current $I_D$ of the MISFET in FIG. 1F is approximately 5% higher at the pentode region in comparison with the conventional MISFET in FIG. 15F, and the conductance $g_m$ is also slightly higher at the pentode region. The pentode region represents the saturation region of curve $V_D$-$I_D$.

Figure 5:
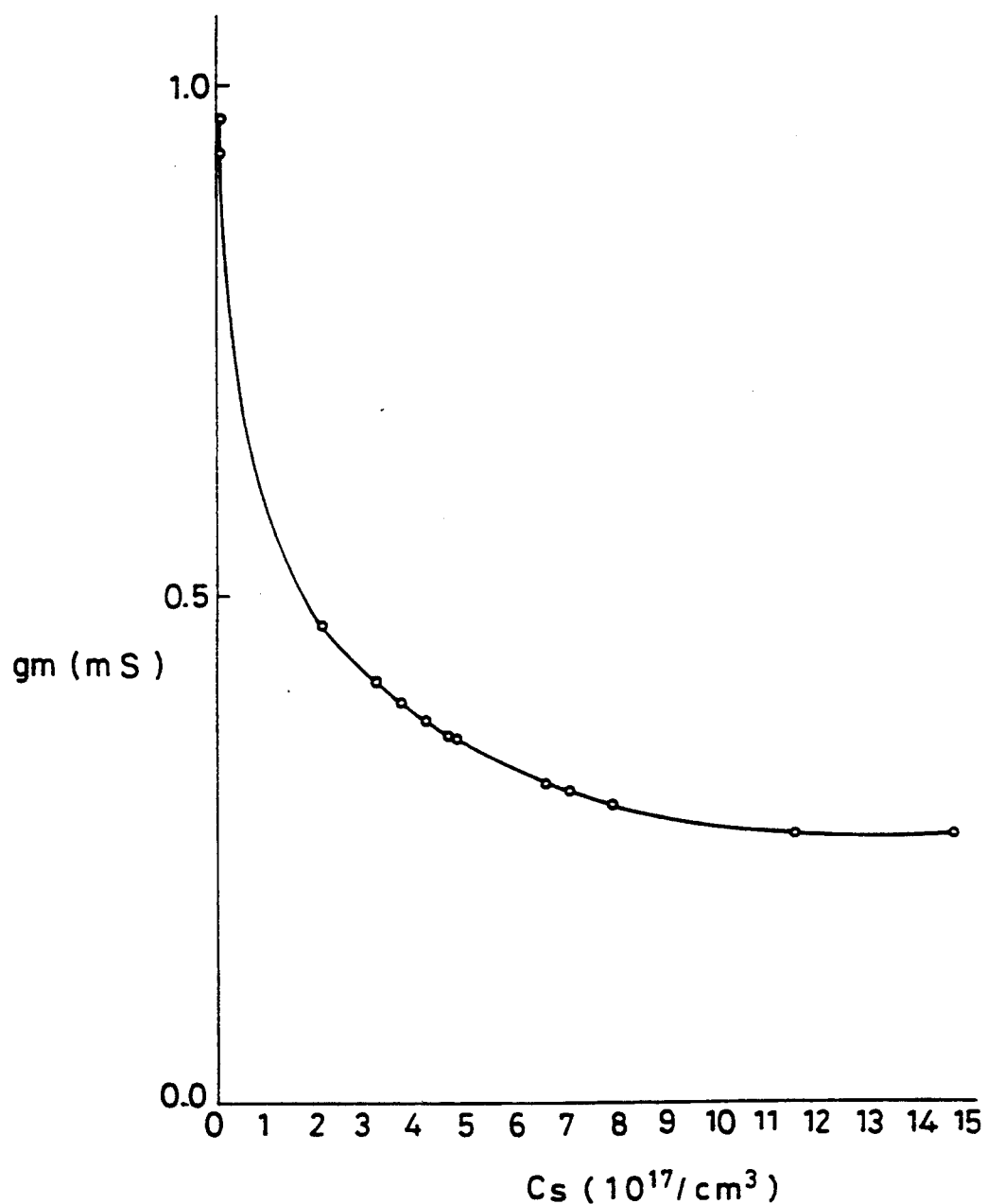
FIG. 5 is a graph showing the relationship between the impurity concentration $C_S$ of the channel layer and the transconductance gm.

Referring to FIG. 5, the dependence of conductance $g_m = \partial I_D / \partial V_G$ (Ms) of the channel layer at the triode region on the impurity concentration $C_S$ ($10^{17}/cm^3$) of the channel layer is shown. In this graph, not only the impurity concentration $C_S$ of the channel layer, but also the impurity concentration $C_B$ of the substrate and the thickness $D_S$ of the channel layer are varied within the range that meets the condition to maintain the threshold voltage Vth to 0.6 V described in connection with FIG. 3. However, conductance $g_m$ varies depending systematically only on the impurity concentration $C_S$ of the channel layer irrespective of the changes in the impurity concentration $C_B$ of the substrate and the thickness $D_S$ of the channel layer. This is because the low impurity concentration of the surface region reduces the transverse electric field at the surface region, while the surface potential which corresponds to threshold voltage keeps a constant value. Consequently, it is appreciated that the conductance gm of the MISFET is dependent mainly only upon the impurity concentration $C_S$ of the channel layer.

Figure 6D:
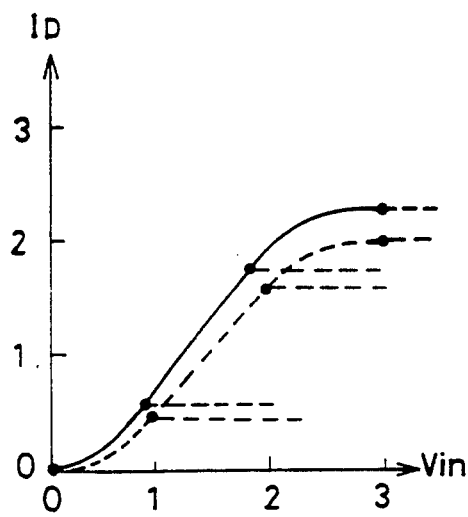
FIGS. 6B-6D are graphs showing the various characteristics of the inverter of FIG. 6A.
Figure 6B:
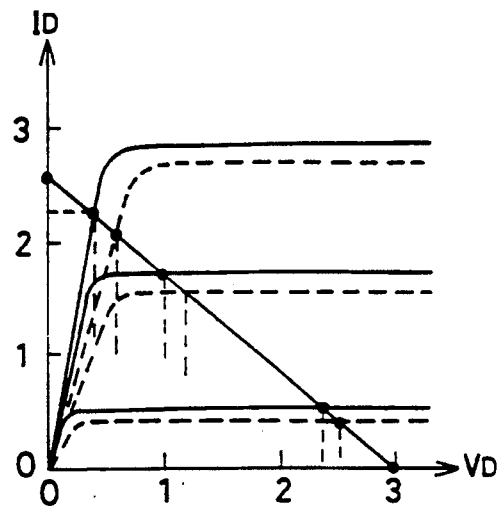
Figure 6A:
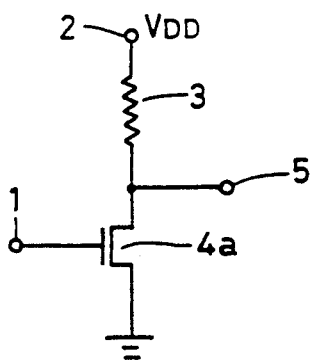
FIG. 6A is a circuit diagram of a MISFET of FIG. 1F comprising an inverter.
Figure 6C:
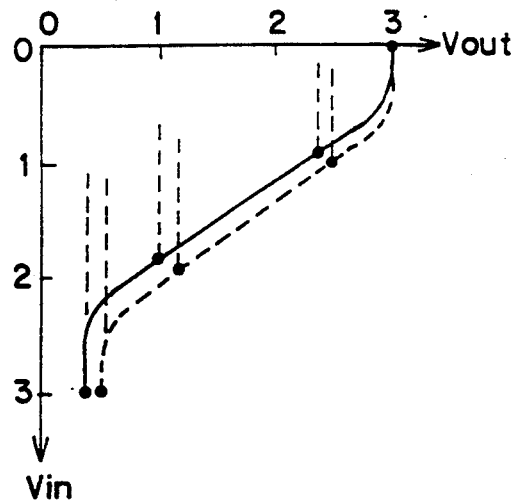
Figure 18D:
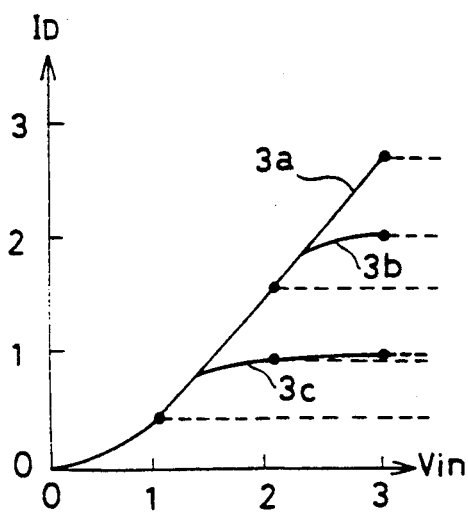
FIGS. 18B-18D are graphs showing the various characteristics of the inverter of FIG. 18A.
Figure 18B:
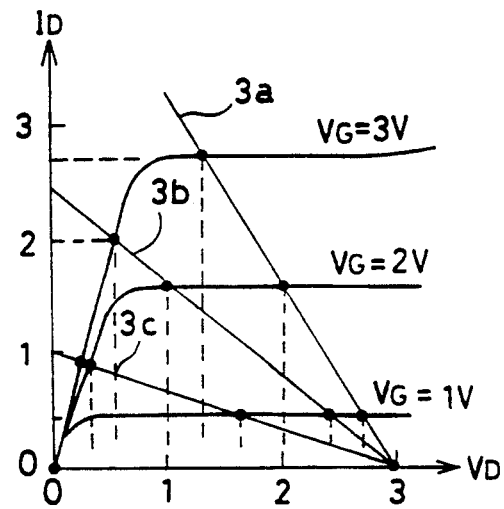
Figure 18A:
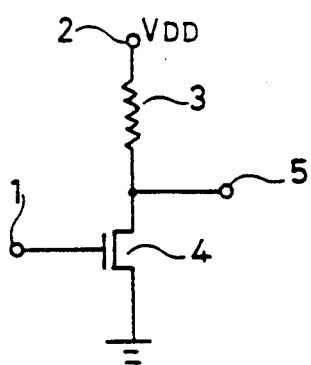
FIG. 18A is a circuit diagram of an inverter comprising the conventional MISFET of FIG. 15F, comprising the inverter.
Figure 18C:
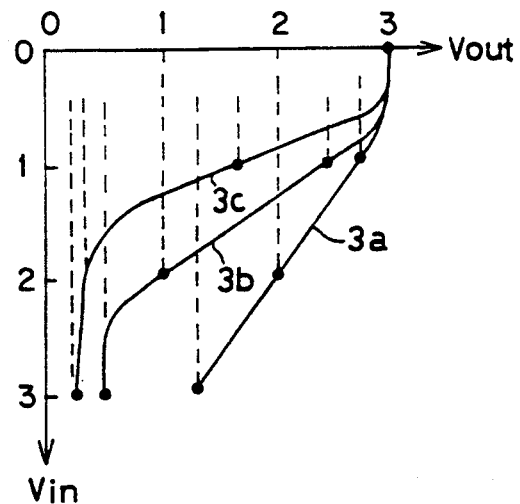
Figure 19:
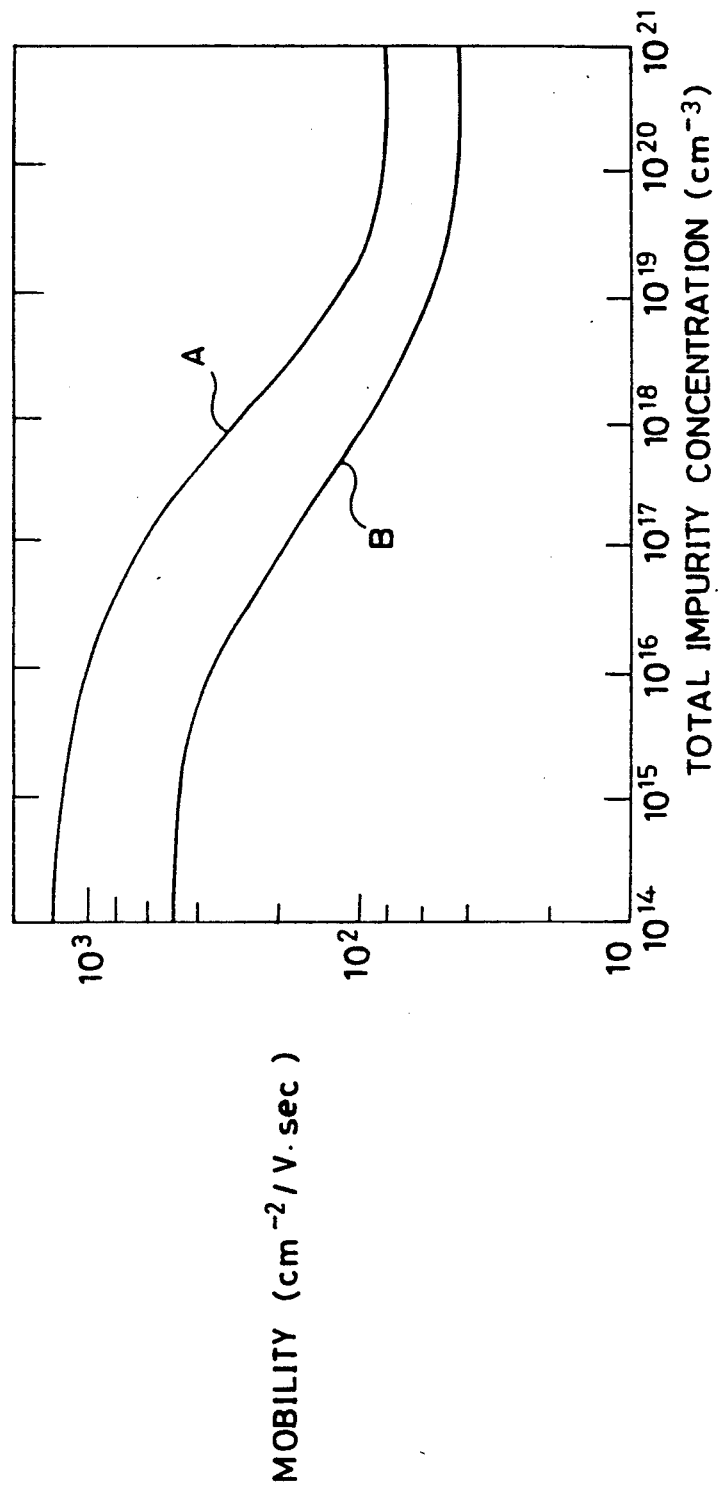
FIG. 19 is a graph showing the relation of the impurity concentration to the mobility of the carriers within the silicon at room temperature.

Referring to FIG. 6A, an inverter circuit similar to the inverter of FIG. 18A is shown. The inverter of FIG. 6A employs the MISFET of FIG. 1F as the driver 4a. The graphs of FIGS. 6B, 6C and 6D are similar to FIGS. 18B, 18C and 18D, respectively, wherein the solid line curves represent the various characteristics of the inverter of FIG. 6A, while the broken line curves represent the characteristics of the inverter of the FIG. 18A. As can be seen from FIG. 6D, the consumption current $I_D$ of the FIG. 6A inverter is greater than that of the FIG. 18A inverter. This means that the propagation delay time tpd of the inverter will decrease since the current term $I_D(t)$ of equation (1) is increased. Also from FIG. 6C, it can be seen that the ratio of the onvoltage to the off-voltage of the output voltage Vout is getting larger to expand the noise margin, which results in an increase of the tolerance to noise for the inverter.

In a semiconductor circuit, it will become easier to lower the source voltage if the noise margin is expanded. However, in order to lower threshold voltage of the MISFET further below 0.6 V, it is necessary to operate the MISFET at a low temperature due to the restrictions of the subthreshold slope. At low temperatures, the effect of the lattice scattering with respect to the mobility of the carriers will be relatively smaller compared to the effect of impurity scattering. Accordingly, it will become more important to decrease the impurity concentration of the channel layer in order to raise the mobility of the carriers.

Referring to FIGS. 7A–7F, a description is given of a structure and its manufacturing process of a MISFET in accordance with another embodiment of the present invention.

Figure 7A:
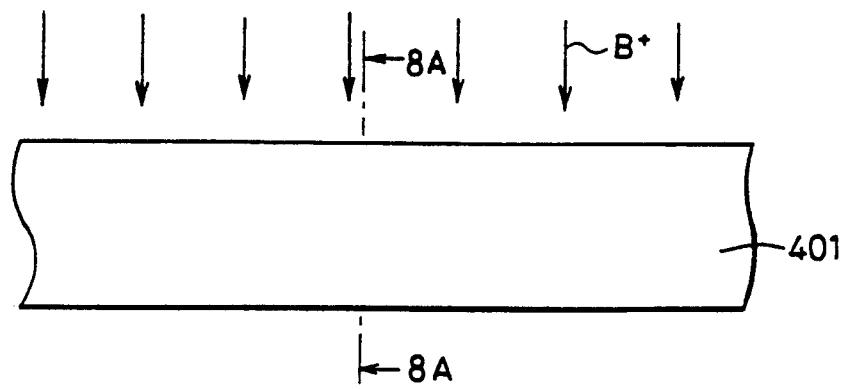
FIGS. 7A-7F are sectional views showing the process of manufacturing a MISFET according to another embodiment of the invention.
Figure 8A:
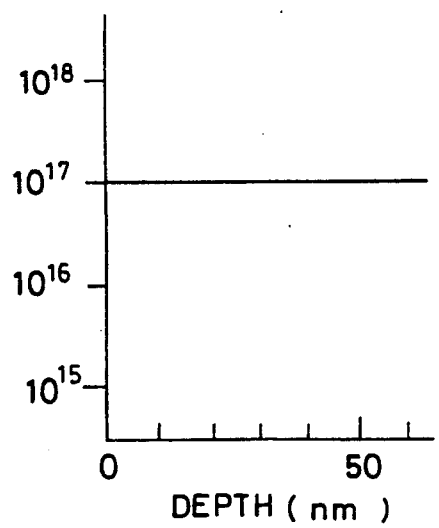
FIGS. 8A, 8B and 8C are graphs showing the impurity concentration distributions at sections taken along line 8A—8A of FIG. 7A, line 8B—8B of FIG. 7B, and line 8C—8C of FIG. 7C, respectively.

Referring to FIG. 7A, boron ions B+ are implanted into a silicon substrate 401 to be annealed sufficiently. As seen from FIG. 8A showing the impurity concentration distribution at a section taken along line 8A—8A of FIG. 7A, the substrate 401 has an impurity concentration of approximately $1 \times 10^{17}/cm^3$ after the annealing. This means that the substrate 401 of FIG. 7A has an impurity concentration that is lower than the impurity concentration of $5 \times 10^{17}/cm^3$ of the substrate 301 in FIG. 1A.

Figure 7B:
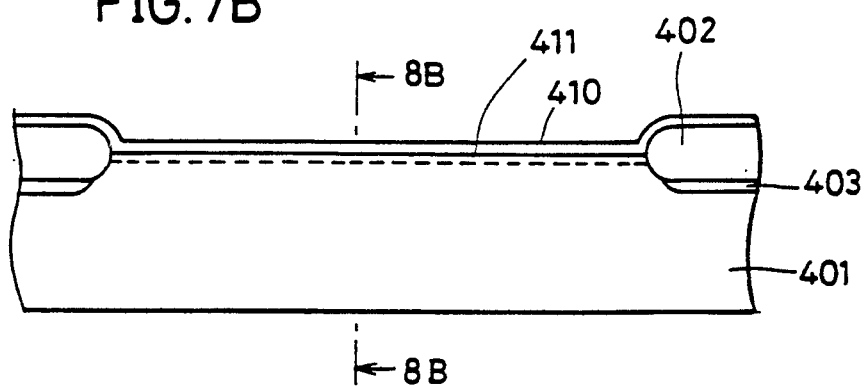
Figure 8B:
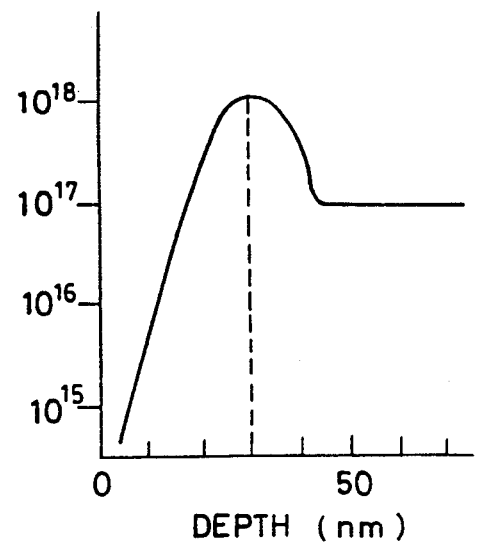

Referring to FIG. 7B, an isolation oxide film 402 and a channel cut region 403 are formed in a similar manner as in FIG. 1B. Next, a silicon oxide film 410 is deposited on substrate 401 to a thickness of approximately 20–30 nm. Through this silicon oxide film 410, boron ions are implanted into silicon substrate 401 with the dose rate of approximately $2 \times 10^{12}/cm^2$ at a low acceleration energy of less than 10 KeV to form a high impurity concentration layer 411 for threshold voltage control. FIG. 8B shows the impurity concentration at the section taken along line 8B—8B of FIG. 7B. In this graph, the broken vertical line defines the location of the interface of silicon oxide film 410 and silicon substrate 401.

Figure 7C:
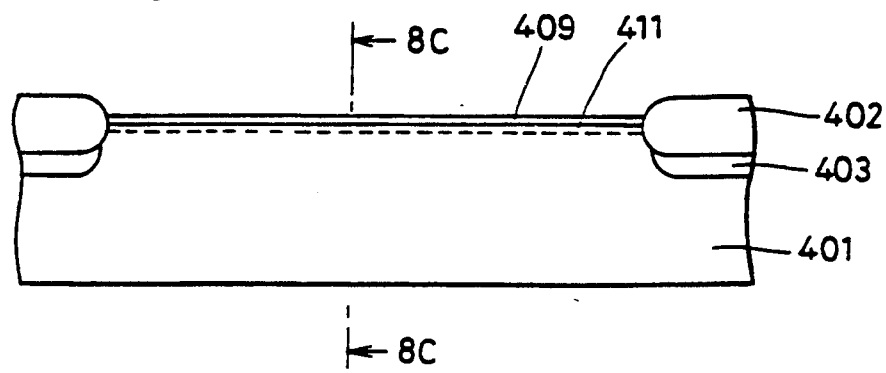
Figure 8C:
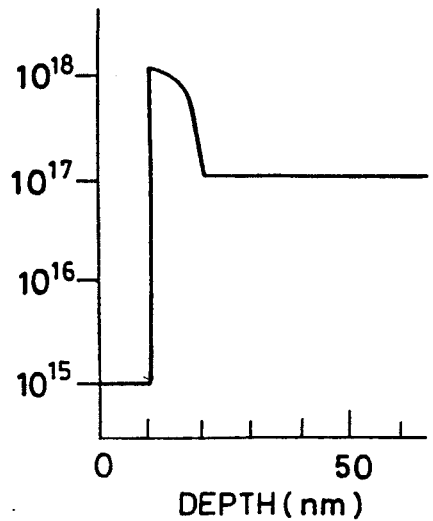

Referring to FIG. 7C, the silicon oxide film 410 is removed, and an epitaxial layer 409 having an impurity concentration of less than approximately $1 \times 10^5/cm^3$ is grown on a threshold voltage control layer 411 to a thickness of approximately 10–20 nm at a relatively low temperature. FIG. 8C illustrates the impurity concentration distribution at the section taken along line 8C—8C of FIG. 7C, with threshold voltage control layer 411 having a thickness of approximately 10 nm.

Figure 7D:
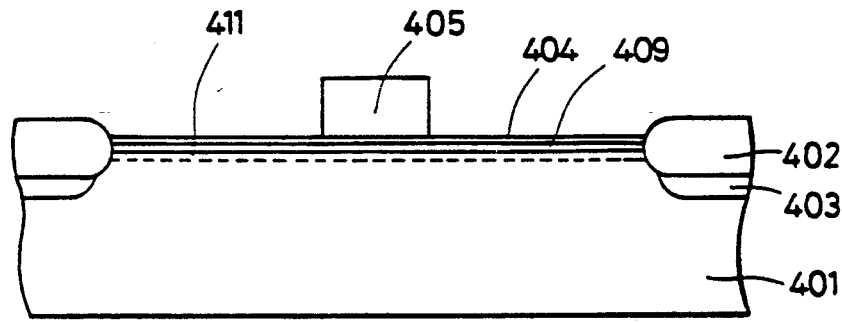

Referring to FIG. 7D, a gate insulating film 404 and gate electrode 405 are formed in the same manner as in FIG. 1D.

Figure 7E:
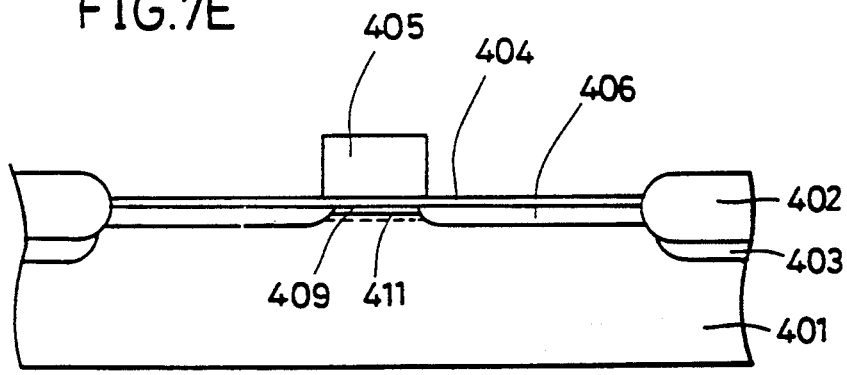

Referring to FIG. 7E, source/drain regions 406 are formed in the same manner as in FIG. 1E. In this case, source/drain regions 406 are formed with a thickness exceeding threshold voltage control layer 411.

Figure 7F:
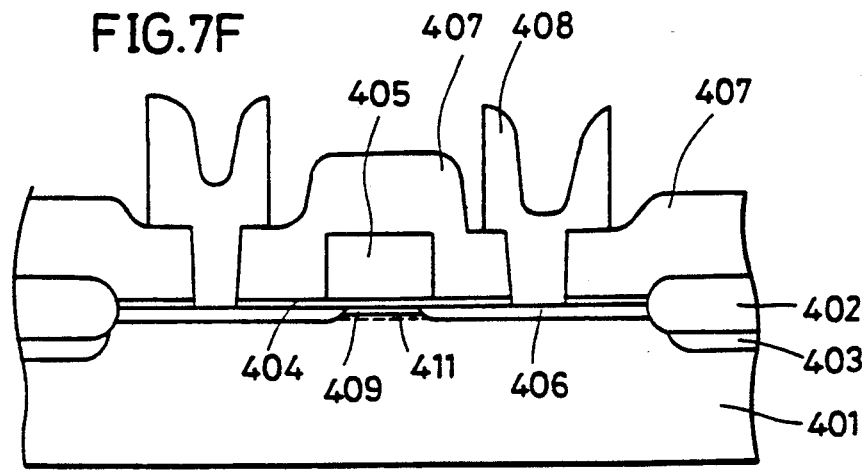

Referring to FIG. 7F, an interlayer film 407 and source/drain electrodes 408 are formed in the same manner as in FIG. 1F, completing a MISFET of the embodiment. As mentioned above, source/drain region 406 of the MISFET of FIG. 7F has a thickness exceeding threshold voltage control layer 411. Accordingly, the p-type substrate 401 has an impurity concentration of $1 \times 10^{17}/cm^3$ which is lower than the $5 \times 10^{17}/cm^3$ impurity concentration of substrate 301 in FIG. 1E at the area in contact with the bottom of n-type source/drain regions 406. Thus, the MISFET of FIG. 7F has the drain breakdown voltage improved in comparison with the MISFET of FIG. 1F and the junction capacitance may be reduced.

Figure 9:
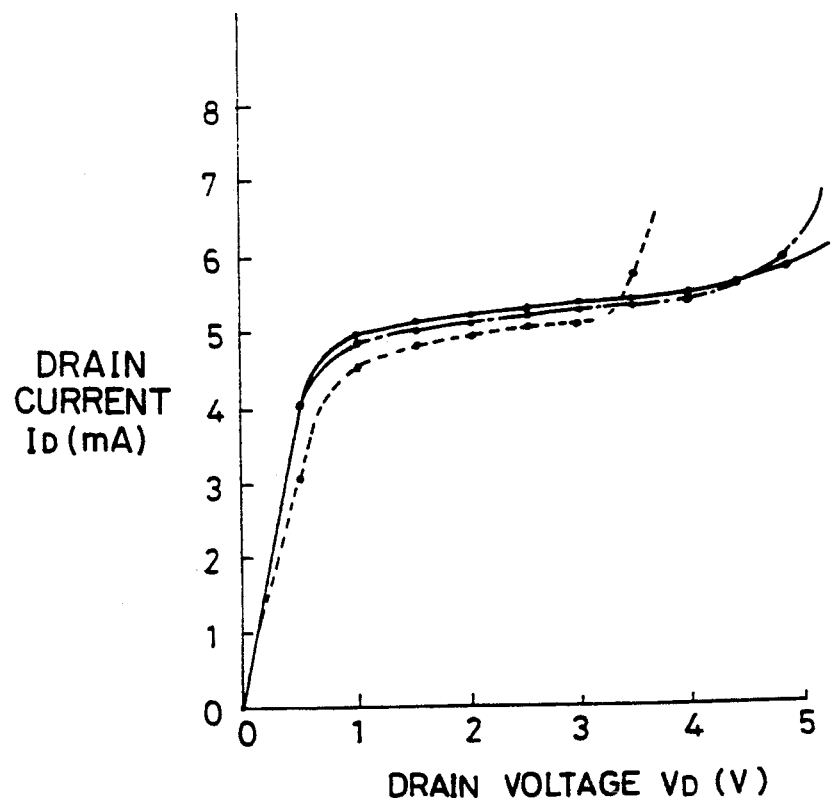
FIG. 9 is a graph showing the relationship between the drain voltage and the drain current of the MISFET in FIG. 7F.

Referring to FIG. 9, the relationship between the drain voltage $V_D$ and the drain current $I_D$ of the MISFET in FIG. 7F is illustrated with a solid line curve. In this graph, the substrate potential and the source potential are assumed to be 0 V, while the gate potential is assumed to be 5 V. For comparison, the dash-dot line curve represents the $V_D$–$I_D$ relation of the MISFET in FIG. 1F, while the broken line curve represents the $V_D$–$I_D$ relation of the conventional MISFET in FIG. 15F. It will be understood from this graph that the MISFET of FIG. 7F will have the drain breakdown voltage improved without degrading the improved level of conductance $g_m$, compared with that of FIG. 1F.

Figure 10A:
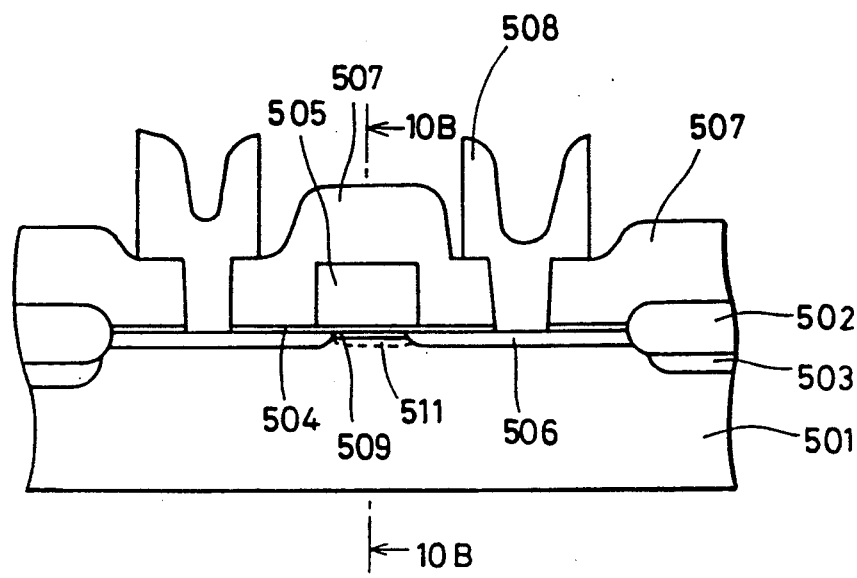
FIG. 10A is a sectional view of another embodiment of the invention.

Referring to FIG. 10A, another embodiment of the present invention is shown. The MISFET in FIG. 10A comprises a silicon substrate 501, an isolation oxide film 502, a channel cut region 503, a gate insulating film 504, a gate electrode 505, a source/drain region 506, a channel layer 509, a threshold voltage control layer 511, an interlayer insulating film 507, and source/drain electrodes 508.

Figure 10B:
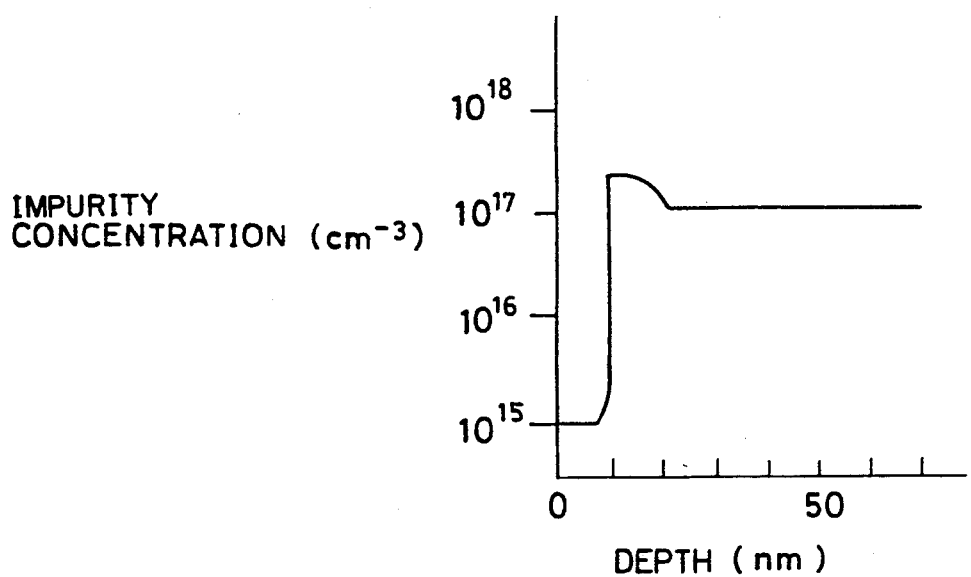
FIG. 10B is a graph showing an impurity concentration distribution at a section taken along line 10B—10B of FIG. 10A.

The MISFET in FIG. 10A is similar to the MISFET in FIG. 7F, except that the gate electrode 505 has a small work function. A gate electrode 505 with such a small work function can be formed using a p-type polycrystalline silicon of a high impurity concentration of about $10^{19}$–$10^{20}/cm^3$, for example. Since gate electrode 505 has a small work function of about $-0.4$ to $-0.8$ eV, the channel layer 509 underlying gate insulating film 504 has its energy band status not in the flat band status but in the accumulation status, when gate voltage is not being supplied. The flat band status and the accumulation status are described in pages 264–271 of "Physics and Technology of Semiconductor Device" by A. S. Grove, published by John Wiley & Sons. Not only threshold voltage control layer 511, but also gate electrode 506 having a small work function contributes to the control of the threshold voltage. (Refer to pages 321–327 of the above mentioned A. S. Grove's book.) Therefore, as shown in FIG. 10B, the impurity concentration of threshold voltage control layer 511 can be lowered such as to approximately $2 \times 10^{17}/cm^3$. FIG. 10B shows the impurity concentration distribution beneath gate insulating film 504 at the section taken along line 10B—10B of FIG. 10A.

When the impurity concentration of the threshold voltage control layer is high, the manufacturing process must be carried out at a lower temperature in order to prevent diffusion of impurities. It will be difficult to obtain a gate insulating film of high quality at a relatively low temperature, leading to the possibility that the annealing of the source/drain regions having ions implanted will be insufficient. The MISFET of FIG. 10A allows the manufacturing process to be executed at a higher temperature compared with the MISFET in FIG. 7F, as well as to reduce the body factor and to enhance the saturation voltage. The body factor is defined on page 243 in VLSI Electronics: Microstructure Science Vol. 18.

Referring to FIGS. 11A–11F, a description is given of the structure and the manufacturing process therefor of a MISFET in accordance with another embodiment of the invention.

Referring to FIG. 11A, boron ions B+ are implanted into silicon substrate 601 and annealed sufficiently in the same manner as in FIG. 1A. As can be seen from FIG. 12A showing the impurity concentration distribution at the section taken along line 12A—12A of FIG. 11A, substrate 601 has an impurity concentration of approximately $5 \times 10^{17}/cm^3$ after the annealing.

Referring to FIG. 11B, a first isolation oxide film 602 and the channel cut region 603 are formed in the same manner as in FIG. 1B. Next, a silicon pad layer 612 with a thickness in the range of 40 to 100 nm is formed to cover the surface of substrate 601 and the first isolation oxide film 602. Boron ions are implanted into silicon pad layer 612 at the acceleration energy of 10-20 KeV and with the dose rate of $2 \times 10^{11} - 5 \times 10^{11}/cm^2$. Then the implanted impurities are annealed. FIG. 12B shows the impurity concentration distribution at the section taken along line 12B—12B of FIG. 11B.

Referring to FIG. 11C, a silicon thin layer 609 having a low impurity concentration is deposited on silicon pad layer 612 to the thickness of approximately 10-20 nm at a relatively low temperature of 550°-700° C. If a temperature higher than 700° C. is adopted, the impurities will be liable to diffuse. On the other hand, if a temperature lower than 550° C. is adopted, it will take much time to epitaxially grow the crystal layer and also to activate the impurity regions. The silicon pad layer 612 and silicon thin layer 609 are made monocrystalline in an epitaxial manner at least above the region where silicon pad layer 612 is in contact with substrate 601. A second isolation oxide film 613 is then formed by selectively oxidizing silicon pad layer 612 and silicon thin layer 609 at a relatively low temperature of 600°-700° C. FIG. 12C depicts the impurity concentration distribution at the section taken along line 12C—12C of FIG. 11C.

Figure 11D:
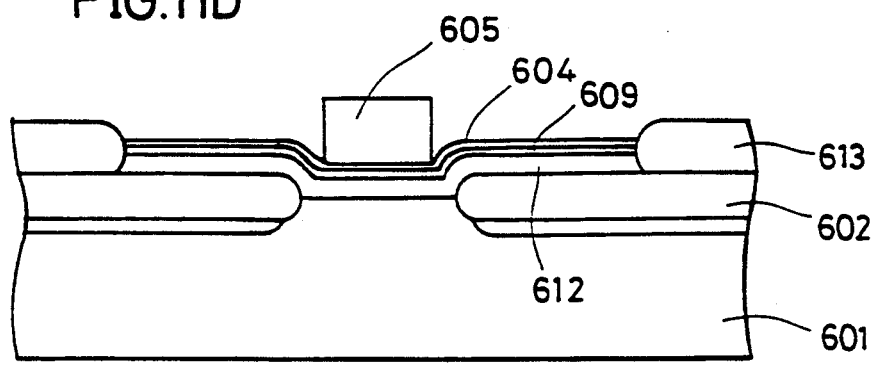
Figure 12A:
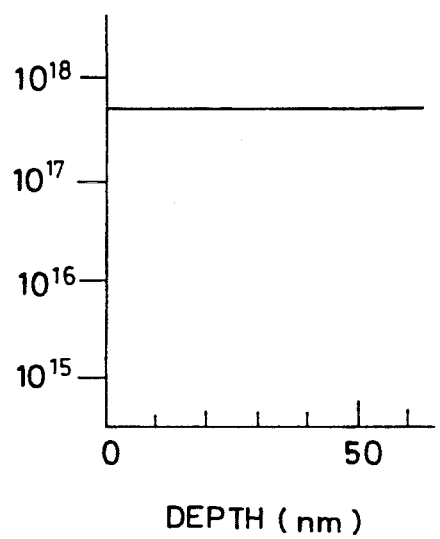
FIGS. 12A, 12B and 12C are graphs showing the impurity concentration distributions at sections taken along line 12A—12A of FIG. 11A, line 12B—12B of FIG. 11B, and line 12C—12C of FIG. 11C, respectively.
Figure 12B:
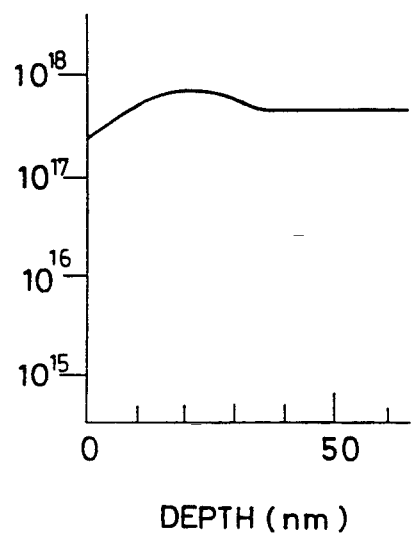
Figure 12C:
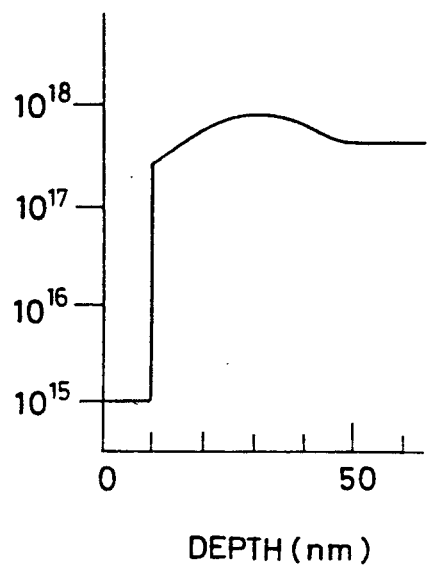

Referring to FIG. 11D, a gate insulating film 604 is formed on silicon thin layer 609, followed by the formation of a gate electrode 605 upon the gate insulating film 604.

Figure 11E:
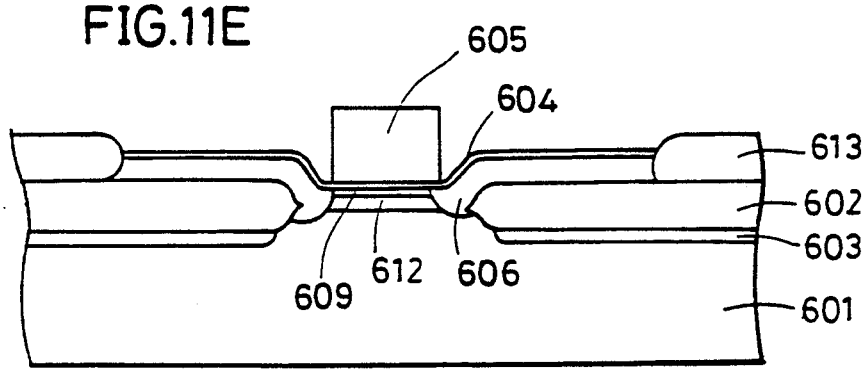

Referring to FIG. 11E, arsenic is ion-implanted utilizing gate electrode 605 and isolation oxide films 613 and 602 as masks, followed by annealing the implanted arsenic ions at a relatively low temperature of 600°-700° C. to form source/drain region 606.

Figure 11F:
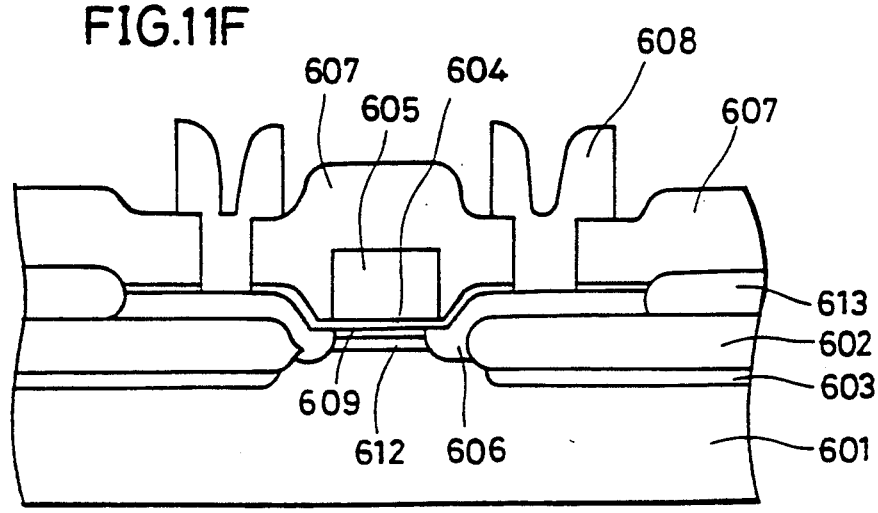

Referring to FIG. 11F, an interlayer insulating film 607 and source/drain electrode 608 are formed to complete a MISFET. Regarding the MISFET of FIG. 11F, the major part of source/drain region 606 is formed over the first isolation oxide film 602 resulting in a smaller junction capacitance between source/drain region 606 and substrate 601. Thus, the MISFET of FIG. 11F has its operating rate further improved than that of FIG. 1F.

The silicon pad layer 612 is provided for the purpose of reducing the resistance of the portion above the first isolation oxide film 602 of source/drain region 606. Therefore, silicon pad layer 612 and silicon thin layer 609 may be replaced by other low resistance layers in the region above the first isolation oxide film 602 of source/drain region 606. It will be understood that the MISFET of FIG. 11F may have an impurity concentration distribution such as is shown in FIG. 8C at the region beneath gate insulating film 604. It will also be appreciated that the MISFET of FIG. 11F may have a gate electrode 605 with a negative small work function of preferable −0.8 eV to −0.4 eV as well as an impurity concentration distribution such as is shown in FIG. 10B.

Figure 13A:
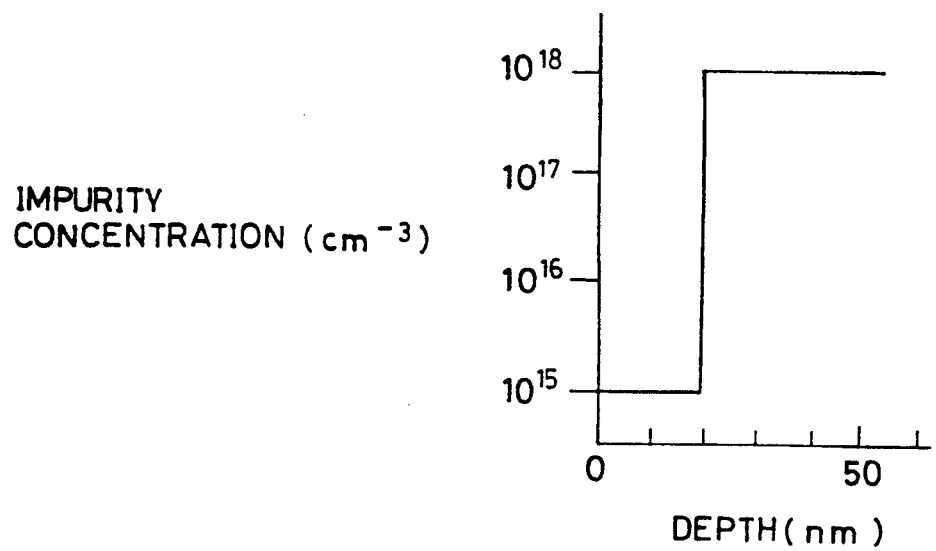
FIGS. 13A and 13B are graphs showing the change in the thickness of the channel layer corresponding to the change in the thickness of the gate insulating film.
Figure 13B:
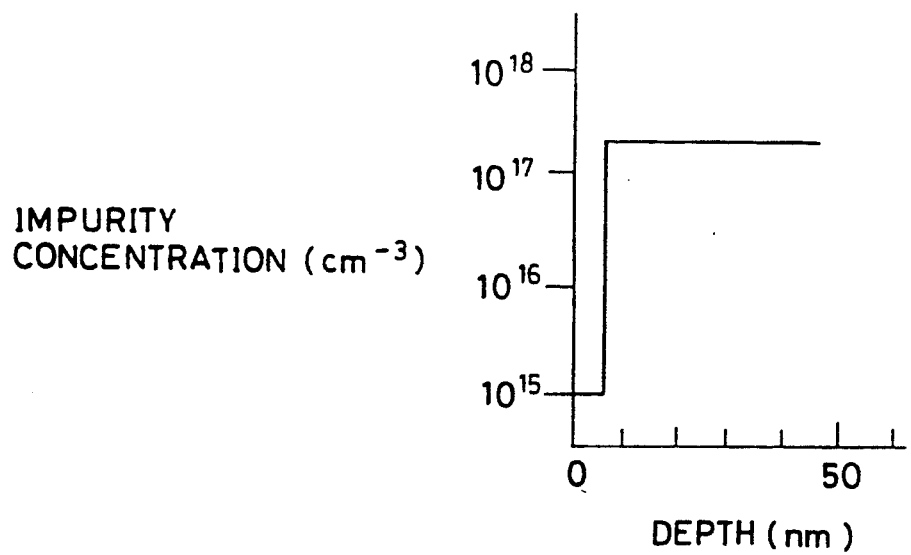

In the above embodiments, a MISFET with a gate insulating film of approximately 7 nm thickness and a channel layer of approximately 10 nm thickness has been described. When the gate insulating film is less than 7 nm, it is possible to make the channel layer thicker as shown in FIG. 13A. The abscissa of FIG. 13A represents the thickness beneath the gate insulating film, and the ordinate represents the impurity concentration. On the contrary, in the case where the gate insulating film is thicker than 7 nm, the channel layer should be made thinner as shown in FIG. 13B.

Figure 14A:
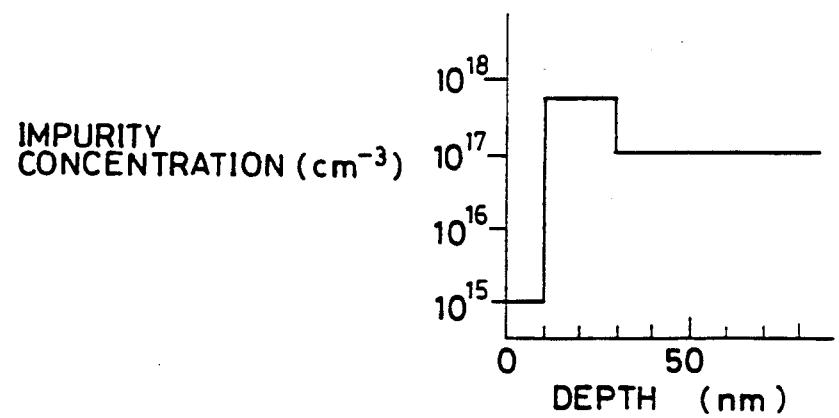
FIGS. 14A-14C are graphs showing the variations of the threshold voltage control layer.
Figure 14B:
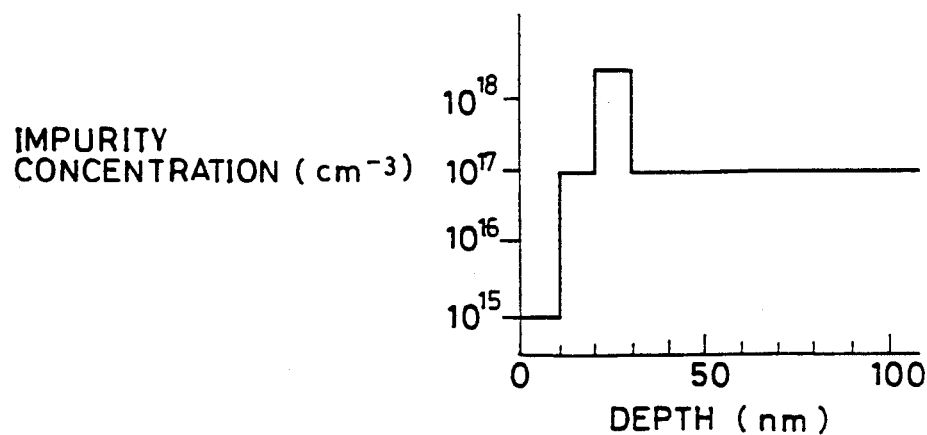
Figure 14C:
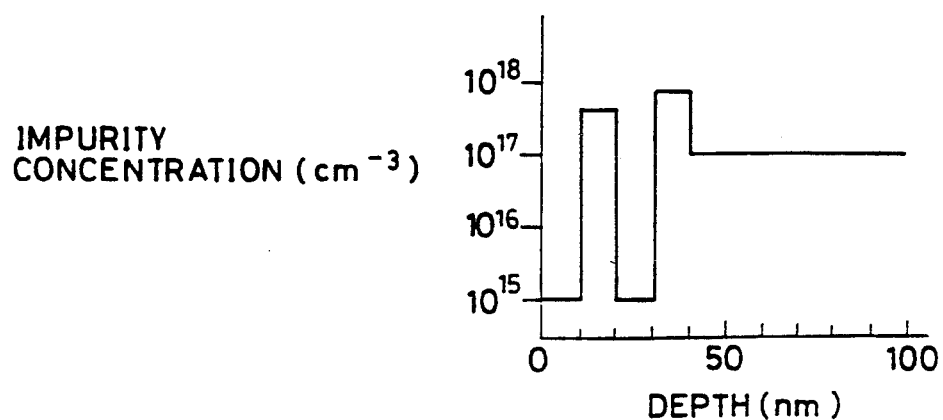
Figure 14D:
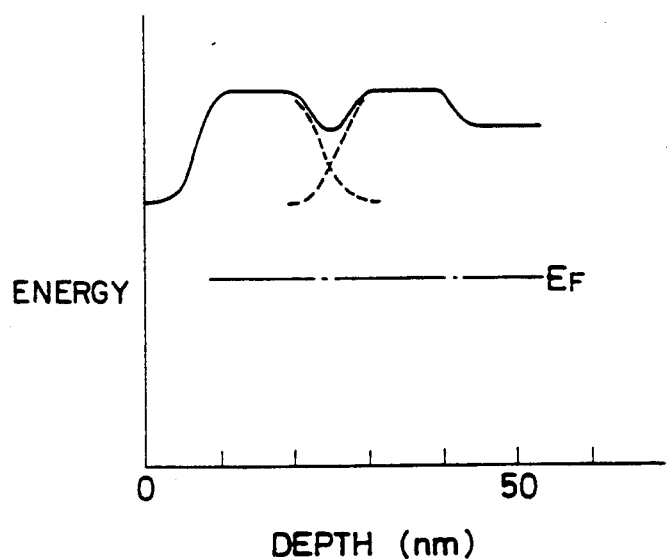
FIG. 14D is a graph showing the energy band structure in the vicinity of the threshold voltage control layer shown in FIG. 14C.

Also, when the threshold voltage control layer is made thick, the impurity concentration of the threshold voltage control layer may be lowered as shown in FIG. 14A. When the threshold voltage control layer is formed in a deeper position, slightly apart from the channel layer, there is an advantage that it will become difficult for the high concentration impurities in the threshold voltage control layer to diffuse into the channel layer, as shown in FIG. 14B. Referring to FIG. 14C, it can be seen that a plurality of threshold voltage control layers may be provided. In this case, since the energy band is pinned by both threshold voltage control layers having high impurity concentration as shown in FIG. 14D, the impurity concentration of the layer sandwiched between the threshold voltage control layers may be reduced provided that it is thin. In FIG. 14D, the horizontal axis represents the depth (nm) form the surface, while the vertical axis represents the energy of electron by an arbitrary unit. A horizontal line $E_F$ shown by a chained line represents the Fermi level and a curve shown by a solid line represents the lower limit of the conduction energy band.

Though the above embodiments have been described with an n-channel MISFET, it will be readily understood by those skilled in the art that the present invention may also be applied to p-channel MISFETs.

From the foregoing detailed description, a high speed micro MISFET in accordance with the present invention may be provided having a high carrier mobility. Also, a micro MISFET that is less susceptible to the effect of noise may be provided. Furthermore, a micro MISFET adaptable to high speed at a low temperature may be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A micro MIS type FET comprising:
   a semiconductor substrate of a first conductivity type;
   a pair of source/drain regions of a second conductivity type formed in a surface of said semiconductor substrate and spaced apart by a distance of less than 2 μm;
   a channel layer of said first conductivity type having an impurity concentration of less than $1 \times 10^{16}/cm^3$ formed between said source/drain regions in said substrate surface, a lower boundary of said channel layer having a depth less than depths of said source/drain regions;
   a first conductivity type threshold voltage control region of impurity concentration greater than $1 \times 10^{17}/cm^3$ formed in said substrate surface beneath said lower boundary of said channel layer; and an isolation insulating film selectively formed on said semiconductor substrate, and an epitaxial layer extending from said surface of said semiconductor substrate over to said isolation insulating film;

wherein said source/drain regions extends also into portions of said epitaxial layer over said isolation insulating film, and said substrate has an abrupt change in impurity concentration at said lower boundary of said channel layer.

2. A micro MIS type FET comprising:

a semiconductor substrate of a first conductivity type;

a pair of source/drain regions of a second conductivity type formed in a surface of said semiconductor substrate and spaced apart by a distance of less than 2 μm, a channel layer of said first conductivity type having an impurity concentration of less than $1 \times 10^{16}/cm^3$ formed between said source/drain regions in said substrate surface, said channel layer formed to have a depth less than depths of said source/drain regions;

a first conductivity type threshold voltage control region having an impurity concentration of more than $1 \times 10^{17}/cm^3$ formed in said substrate surface beneath said channel layer; and an isolation insulating film selectively formed on said semiconductor substrate, and an epitaxial layer extending from the surface of said semiconductor substrate to over said isolation insulating film, said source/drain regions extending also into portions of said epitaxial layer over said isolation insulating film.

3. The MIS type FET according to claim 2, wherein said threshold voltage control region comprises a threshold voltage control layer having an impurity concentration exceeding $1 \times 10^{17}/cm^3$, said threshold voltage control layer formed to have a depth less than depths of said source/drain regions.

4. The MIS type FET according to claim 2, wherein said epitaxial layer is doped with only a single impurity.

* * * * *